(12) United States Patent
Plouchart et al.

(10) Patent No.: US 11,888,445 B2
(45) Date of Patent: Jan. 30, 2024

(54) VARIABLE CAPACITOR DEVICES WITH DIFFERENTIAL VOLTAGE CONTROL

(71) Applicant: International Business Machines Corporation, Armonk, NY (US)

(72) Inventors: Jean-Olivier Plouchart, New York, NY (US); Sudipto Chakraborty, Plano, TX (US); Daniel Joseph Friedman, Sleepy Hollow, NY (US); Baibhab Chatterjee, West Lafayette, IN (US)

(73) Assignee: International Business Machines Corporation, Armonk, NY (US)

( * ) Notice: Subject to any disclaimer, the term of this patent is extended or adjusted under 35 U.S.C. 154(b) by 23 days.

(21) Appl. No.: 17/723,165

(22) Filed: Apr. 18, 2022

(65) Prior Publication Data
US 2023/0336123 A1 Oct. 19, 2023

(51) Int. Cl.
*H03B 5/12* (2006.01)
*H01G 5/40* (2006.01)

(52) U.S. Cl.
CPC .......... *H03B 5/1253* (2013.01); *H01G 5/40* (2013.01); *H03B 5/1293* (2013.01)

(58) Field of Classification Search
CPC ....... H03B 5/1253; H03B 5/1293; H01G 5/40
See application file for complete search history.

(56) References Cited

U.S. PATENT DOCUMENTS

| | | | |
|---|---|---|---|
| 7,230,503 B1 * | 6/2007 | Huang | H03J 3/20 331/117 R |
| 7,688,155 B2 | 3/2010 | Han et al. | |
| 8,854,791 B2 | 10/2014 | Takahashi | |
| 9,610,044 B2 | 4/2017 | Van Helleputte | |
| 9,837,959 B2 | 12/2017 | Ainspan et al. | |
| 10,727,847 B1 * | 7/2020 | Ferriss | H03B 5/124 |
| 2009/0091380 A1 | 4/2009 | Min et al. | |
| 2011/0025415 A1 * | 2/2011 | Mu | H03F 3/2175 330/251 |
| 2011/0248787 A1 * | 10/2011 | Jiang | H03J 3/20 331/177 V |
| 2019/0028059 A1 * | 1/2019 | Kwan | H03B 5/1256 |
| 2020/0162058 A1 | 5/2020 | Lin | |

FOREIGN PATENT DOCUMENTS

CN 101483434 A 7/2009
WO PCT/EP2023/059494 9/2023

OTHER PUBLICATIONS

M. Ferriss et al., "A 12-to-26GHz Fractional-N PLL with Dual Continuous Tuning LC-D/VCOs," 2016 IEEE International Solid-State Circuits Conference, Feb. 2, 2016, pp. 196-198.

(Continued)

*Primary Examiner* — Jeffrey M Shin
(74) *Attorney, Agent, or Firm* — Erik Johnson; Ryan, Mason & Lewis, LLP

(57) ABSTRACT

A variable capacitor device comprises first and second control paths which are configured to enable differential control using first and second transistors of a same doping type in the first and second control paths, respectively, wherein the first and second transistors are configured as voltage variable resistors for tuning a capacitance of the variable capacitor device.

25 Claims, 21 Drawing Sheets

(56) References Cited

OTHER PUBLICATIONS

M. Ferriss et al., "An Integral Path Self-Calibration Scheme for a Dual-Loop PLL," IEEE Journal of Solid-State Circuits, vol. 48, No. 4, Apr. 2013, pp. 996-1008.
C.-H. Han et al., "Linear Frequency Tuning in an LC-resonant System Using a C-V Response Controllable MEMS Varactor," Micro and Nano Systems Letters, vol. 5, No. 1, Dec. 2017, 12 pages.
J. Oehm et al., "Linear Controlled Temperature Independent Varactor Circuitry," In Proceedings of the 28th European Solid-State Circuits Conference, Sep. 24-26, 2002, pp. 143-146.
B. Sadhu et al., "A Linearized, Low-phase-noise VCO-based 25-GHz PLL with Autonomic Biasing," IEEE Journal of Solid-State Circuits, vol. 48, No. 5, May 2013, pp. 1138-1150.
N. Fong et al., "A Low-Voltage Multi-GHz VCO with 58% Tuning Range in SO1 CMOS," Custom Integrated Circuits Conference, May 15, 2002, pp. 423-426.
P. Mell et al., "The NIST Definition of Cloud Computing," Recommendations of the National Institute of Standards and Technology, Special Publication 800-145, Sep. 2011, 7 pages.
A. Maxim, "Notice of Violation of IEEE Publication Principles: A Multi-Rate 9.953-12.5GHz 0.2µm SiGe BiCMOS LC Oscillator Using a Resistor-Tuned Varactor Circuit," IEEE Journal of Solid-State Circuits, Apr. 30, 2006, pp. 918-934, vol. 41, No. 4.

\* cited by examiner

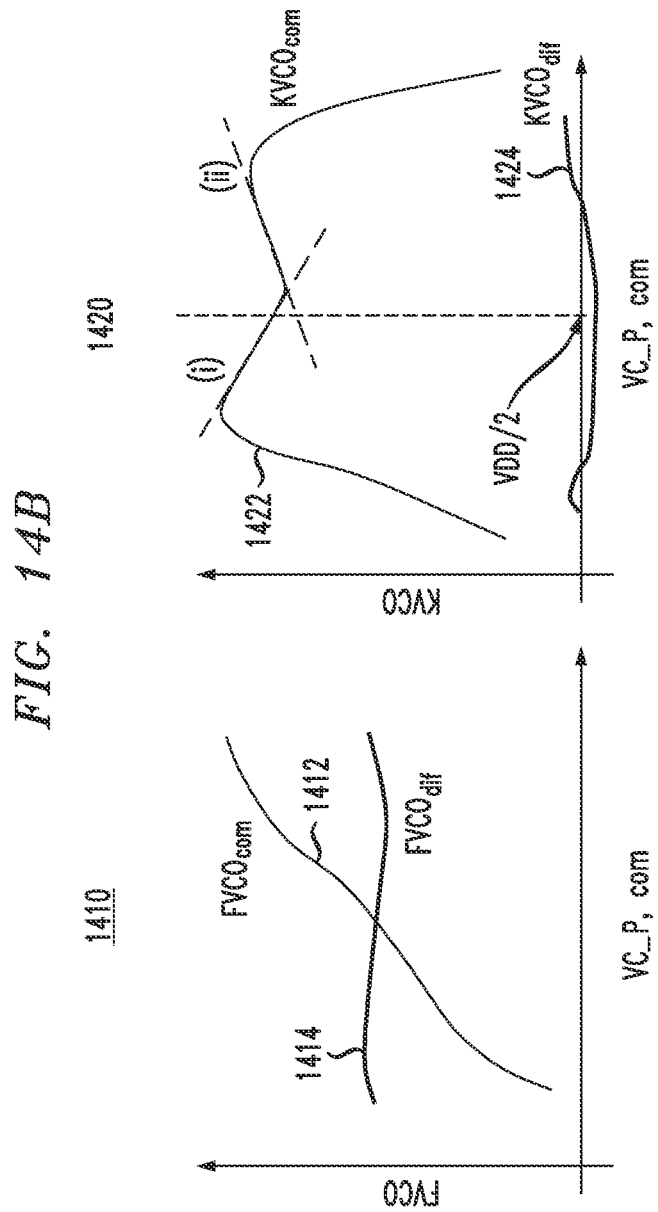

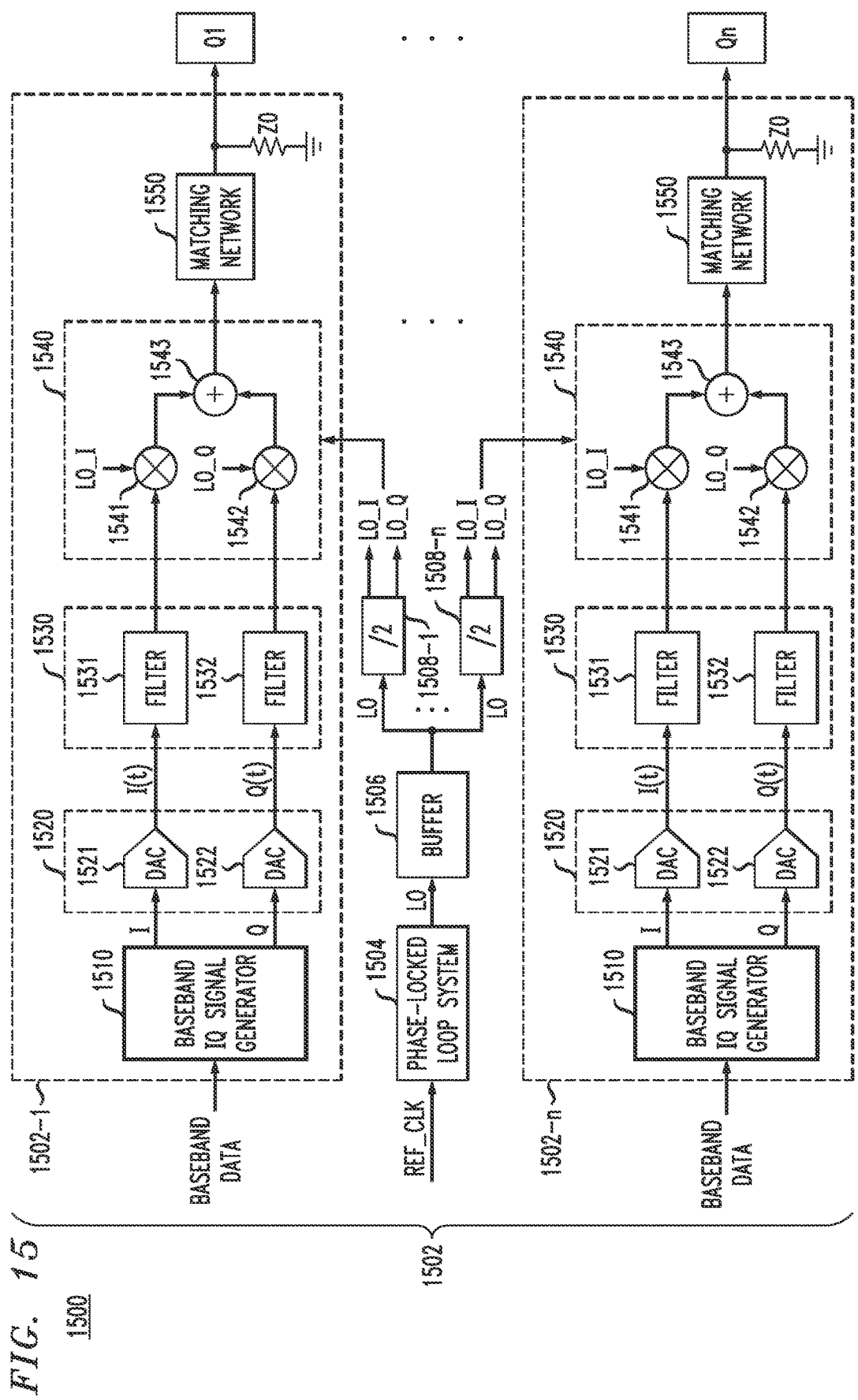

1600

VARIABLE CAPACITOR DEVICES WITH DIFFERENTIAL VOLTAGE CONTROL

BACKGROUND

This disclosure relates generally to voltage-controlled variable capacitor devices and, in particular, variable capacitor devices with differential voltage control for use in continuous frequency tuning of oscillator circuits such as voltage-controlled oscillator (VCO) circuits or any other types of systems which implement a resonant load using a variable capacitor device. A voltage-controlled variable capacitor (alternatively referred to herein as varactor) is a key component that is used in continuous frequency tuning (also known as analog tuning) of oscillator circuits. Conventional varactor devices can exhibit undesirable properties that lead to degraded performance in continuous frequency tuning applications.

For example, a varactor device can have undesirable transfer characteristics, such as a capacitance-to-control voltage transfer curve with a sharp transition from a minimum capacitance ($C_{MIN}$) to a maximum capacitance ($C_{MAX}$) over a relatively narrow control voltage range. In such instances, a derivative of the capacitance-to-control voltage transfer curve of the varactor device translates to significant gain non-uniformity of, e.g., a VCO having an LC resonant tank that is implemented using the varactor. In this regard, effective and flexible techniques for linearizing the response of a varactor device, is desirable. Furthermore, it is desirable to implement a differential control scheme to tune the capacitance of a varactor device since a differential control scheme provides immunity to common mode noise. Typically, regardless of the varactor implementation, differential control of varactors is implemented using complementary transistor structures (e.g., N-type and P-type field-effect transistor (FET) devices) in the control path. A differential control scheme using complementary NFET and PFET devices, however, can result in degraded performance as a result of poor matching between the NFET and PFET devices under process and temperature variation. Another disadvantage associated with conventional varactor devices is that there is no mechanism to independently control a differential varactor gain with respect to a common mode varactor gain.

SUMMARY

Exemplary embodiments of the disclosure include voltage-variable capacitor devices which implement voltage variable resistor tuned capacitor architectures with differential control. In an exemplary embodiment, a variable capacitor device comprises first and second control paths which are configured to enable differential control using first and second transistors of a same doping type in the first and second control paths, respectively, where the first and second transistors are configured as voltage variable resistors for tuning a capacitance of the variable capacitor device.

Advantageously, the variable capacitor device comprises an architecture that enables differential control of the variable capacitor device using transistor devices having a same transistor type (e.g., N-type or P-type) to achieve uniformity and symmetry in transfer characteristics of the variable capacitor device. The architecture of the variable capacitor device eliminates the need to utilize complementary transistor devices (e.g., an N-type and P-type transistor pair) in the control paths to enable differential control of the variable capacitor device, which would otherwise result in degraded performance of the variable capacitor device as a result of poor matching between the complementary transistor devices.

In an exemplary embodiment of the variable capacitor device, the first control path comprises the first transistor and at least one capacitor serially connected between a first terminal and a second terminal of the variable capacitor device, and the second control path comprises the second transistor and at least one capacitor serially connected between the first terminal and the second terminal of the variable capacitor device. The variable capacitor device further comprises differential control terminals comprising a first control terminal and a second control terminal, wherein the first control terminal is coupled to a gate terminal of the first transistor, and the second control terminal is coupled to first and second source/drain terminals of the second transistor. The variable capacitor device further comprises a first tuning terminal and a second tuning terminal, wherein the first tuning terminal is coupled to first and second source/drain terminals of the first transistor, and the second tuning terminal is coupled to a gate terminal of the second transistor.

Advantageously, the implementation of the tuning terminals of the variable capacitor device allows tuning voltages (e.g., static tuning voltages) to be applied to the variable capacitor device. Such tuning voltages provide a mechanism for independently setting common mode and differential mode gains of the variable capacitor device. In addition, the implementation of the tuning terminals of the variable capacitor device provides a mechanism for tuning the effective threshold voltages of the first and second transistors in the first and second control paths and, thus, enabling a parallel combination of two or more instances of the variable capacitor device with appropriately offset effective threshold voltages to form a composite variable capacitor structure with increased linearization.

Another exemplary embodiment includes a device which comprises an oscillator circuit comprising a resonant tank circuit. The resonant tank circuit comprises a variable capacitor device comprising first and second control paths which are configured to enable differential control using first and second transistors of a same doping type in the first and second control paths, respectively, where the first and second transistors are configured as voltage variable resistors for tuning a capacitance of the variable capacitor device.

Another exemplary embodiment includes a device which comprises a voltage-controlled oscillator circuit comprising a resonant tank circuit. The resonant tank circuit comprises a variable capacitor circuit comprising a plurality of variable capacitor devices connected in parallel to first and second tank nodes of the resonant tank circuit. Each variable capacitor device comprises first and second control paths which are configured to enable differential control using first and second transistors of a same doping type in the first and second control paths, respectively, where the first and second transistors are configured as voltage variable resistors for tuning a capacitance of the variable capacitor device.

Another exemplary embodiment includes a system which comprises a voltage-controlled oscillator, and an analog differential tuning control system. The analog differential tuning control system comprises a differential charge pump and a loop filter. The analog differential tuning control system is configured to generate a differential control voltage to tune an output frequency of the voltage-controlled oscillator. The voltage-controlled oscillator comprises a resonant tank circuit. The resonant tank circuit comprises a variable capacitor circuit comprising a plurality of variable capacitor devices connected in parallel to first and second tank nodes of the resonant tank circuit. Each variable capacitor device comprises first and second control paths which are configured to enable differential control using first and second transistors of a same doping type in the first and second control paths, respectively, where the first and second transistors are configured as voltage variable resistors for tuning a capacitance of the variable capacitor device in response to the differential control voltage.

Another exemplary embodiment includes a system which comprises a plurality of quantum bits, an arbitrary waveform generator system, and a phase-locked loop system. The arbitrary waveform generator system comprises a plurality of arbitrary waveform generator channels, where each arbitrary waveform generator channel is coupled to a respective quantum bit of the plurality of quantum bits, and configured to generate a radio frequency signal to control operation of the quantum bit. The phase-locked loop system is configured to generate a local oscillator signal which is utilized by modulation systems in the respective arbitrary waveform generator channels. The phase-locked loop system comprises a voltage-controlled oscillator, and an analog differential tuning control system which comprises a differential charge pump and a loop filter. The analog differential tuning control system is configured to generate a differential control voltage to tune an output frequency of the voltage-controlled oscillator. The voltage-controlled oscillator comprises a resonant tank circuit. The resonant tank circuit comprises a variable capacitor circuit comprising a plurality of variable capacitor devices connected in parallel to first and second tank nodes of the resonant tank circuit. Each variable capacitor device comprises first and second control paths which are configured to enable differential control using first and second transistors of a same doping type in the first and second control paths, respectively, where the first and second transistors are configured as voltage variable resistors for tuning a capacitance of the variable capacitor device in response to the differential control voltage.

Other embodiments will be described in the following detailed description of exemplary embodiments, which is to be read in conjunction with the accompanying figures.

BRIEF DESCRIPTION OF THE DRAWINGS

FIG. 11 schematically illustrates a system for calibrating a phase-locked loop system comprising a voltage-controlled oscillator which implements a variable capacitor device with differential control, according to an exemplary embodiment of the disclosure.

FIGS. 14A and 14B illustrate a calibration process which is performed by the calibration system of FIG. 13, according to an exemplary embodiment of the disclosure.

FIG. 15 schematically illustrates a quantum computing system which implements a phase-locked loop system with a voltage-controlled oscillator implemented using a variable capacitor device with differential control, according to an exemplary embodiment of the disclosure.

DETAILED DESCRIPTION

Figure 1:
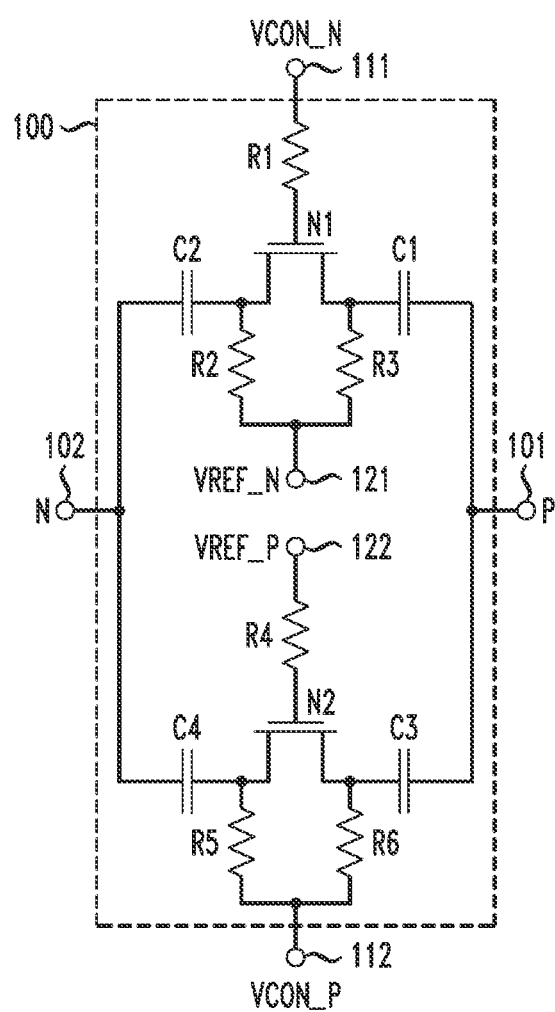
FIG. 1 schematically illustrates a variable capacitor device, according to an exemplary embodiment of the disclosure.

Exemplary embodiments of the disclosure will now be described in further detail with regard to voltage-controlled variable capacitor devices (or varactors) that implement voltage variable resistor tuned capacitor (VVRTC) architectures with differential control. A voltage-controlled variable capacitor device with a VVRTC circuit architecture implements a voltage-independent capacitance (e.g., fixed capacitor) in series with a voltage variable resistor device (e.g., a field-effect transistor (FET) device configured to operate in a linear region) to enable voltage variable capacitance tuning. Exemplary embodiments of the disclosure further include systems and circuitry which implement tunable resonant loads or resonant tank circuits (such as oscillator circuits) which comprise one or more VVRTC varactor devices for capacitance tuning.

It is to be understood that the various features shown in the accompanying drawings are schematic illustrations that are not drawn to scale. Moreover, the same or similar reference numbers are used throughout the drawings to denote the same or similar features, elements, or structures, and thus, a detailed explanation of the same or similar features, elements, or structures will not be repeated for each of the drawings. Further, the term "exemplary" as used herein means "serving as an example, instance, or illustration." Any embodiment or design described herein as "exemplary" is not to be construed as preferred or advantageous over other embodiments or designs.

Further, it is to be understood that the phrase "configured to" as used in conjunction with a circuit, structure, element, component, or the like, performing one or more functions or otherwise providing some functionality, is intended to encompass embodiments wherein the circuit, structure, element, component, or the like, is implemented in hardware, software, and/or combinations thereof, and in implementations that comprise hardware, wherein the hardware may comprise discrete circuit elements (e.g., transistors, inverters, etc.), programmable elements (e.g., application specific integrated circuit (ASIC) chips, field-programmable gate array (FPGA) chips, etc.), processing devices (e.g., central processing units (CPUs), graphics processing units (GPUs), etc.), one or more integrated circuits, and/or combinations thereof. Thus, by way of example only, when a circuit, structure, element, component, etc., is defined to be configured to provide a specific functionality, it is intended to cover, but not be limited to, embodiments where the circuit, structure, element, component, etc., is comprised of elements, processing devices, and/or integrated circuits that enable it to perform the specific functionality when in an operational state (e.g., connected or otherwise deployed in a system, powered on, receiving an input, and/or producing an output), as well as cover embodiments when the circuit, structure, element, component, etc., is in a non-operational state (e.g., not connected nor otherwise deployed in a system, not powered on, not receiving an input, and/or not producing an output) or in a partial operational state.

FIG. 1 schematically illustrates a variable capacitor device, according to an exemplary embodiment of the disclosure. More specifically, FIG. 1 schematically illustrates a voltage variable capacitor device 100 (or varactor 100) having a VVRTC circuit structure with differential control, according to an exemplary embodiment of the disclosure. The varactor 100 comprises a first terminal 101 (or positive P terminal) and a second terminal 102 (or negative N terminal). The first and second terminals 101 and 102 serve as varactor input/output (I/O) terminals for connecting the varactor 100 in a given circuit (e.g., a tank circuit of a VCO). The varactor 100 further comprises differential control terminals 111/112 comprising a first control terminal 111 (or negative control terminal), and a second control terminal 112 (or positive control terminal). The first and second control terminals 111 and 112 are configured to connect to a control system (e.g., charge pump of phase-locked loop (PLL) circuit) to receive respective differential control voltage signals VCON_N and VCON_P for adjusting the capacitance of the varactor 100, the details of which will be explained in further detail below. Moreover, the varactor 100 comprises tuning terminals comprising a first tuning terminal 121, and a second tuning terminal 122. The first tuning terminal 121 and the second tuning terminal 122 are configured to connect to, e.g., a calibration control system to receive a first reference voltage VREF_N (or first tuning voltage) and a second reference voltage VREF_P (or second tuning voltage), respectively, for tuning certain operating characteristics of the varactor 100, the details of which will be explained in further detail below.

As further shown in FIG. 1, the varactor 100 comprises a VVRTC framework, which comprises parallel control paths including (i) a first control path (or negative path) comprising a first transistor N1, a first capacitor C1, and a second capacitor C2, which are serially connected between the first and second terminals 101 and 102 of the varactor 100, and (ii) a second control path (or positive path) comprising a second transistor N2, a third capacitor C3, and fourth capacitor C4, which are serially connected between the first and second terminals 101 and 102 of the varactor 100. In the first path, the first capacitor C1 is connected between the first terminal 101 and a first source/drain terminal of the first transistor N1, and the second capacitor C2 is connected between the second terminal 102 and a second source/drain terminal of the first transistor N1. In the second path, the third capacitor C3 is connected between the first terminal 101 and a first source/drain terminal of the second transistor N2, and the fourth capacitor C4 is connected between the second terminal 102 and a second source/drain terminal of the second transistor N2.

The varactor 100 further comprises a plurality of resistors R1, R2, R3, R4, R5, and R6. The first control terminal 111 is coupled to a gate terminal of the first transistor N1 by the first resistor R1. The first tuning terminal 121 is coupled to the first and second source/drain terminals of the first transistor N1 by the third resistor R3 and the second resistor R2, respectively. The second control terminal 112 is coupled to the first and second source/drain terminals of the second transistor N2 by the sixth resistor R6 and the fifth resistor R5, respectively. The second tuning terminal 122 is coupled to a gate terminal of the second transistor N2 by the fourth resistor R4.

In some embodiments, the first and second transistors N1 and N2 comprise FET devices (e.g., metal-oxide-semiconductor field-effect transistor (MOSFET) devices) of a same doping type. For example, in some embodiments, the first and second transistors N1 and N2 are N-type FET devices. In other embodiments, the first and second transistors N1 and N2 are P-type FET devices. The first and second transistors N1 and N2 can be implemented using any suitable state of the art FET technology, e.g., FinFET. In some embodiments, the capacitors C1, C2, C3, and C4 comprise fixed capacitors (or voltage independent capacitor devices) having a same capacitance value. In some embodiments, the capacitors C1, C2, C3, and C4 comprise metal-insulator-metal (MIM) capacitors, metal-oxide-metal (MOM) capacitors, or other types of capacitor structures which are suitable for the given application. In some embodiments, the resistors R1, R2, R3, R4, R5, and R6 comprise any suitable types of passive resistor devices for semiconductor integrated circuits including, but not limited to, thin-film resistors, polysilicon resistors, etc.

In the exemplary embodiment of FIG. 1, the voltage variable capacitance in each path of the varactor 100 is realized by the series combination of a fixed capacitance and a parasitic impedance (e.g., parasitic capacitance) of a MOSFET device, wherein the parasitic capacitance of the MOSFET device varies with the MOSFET device operating in a linear region. For example, the control voltage signal VCON_N is applied to the first control terminal 111 to change the ON resistance (or channel resistance) of the first transistor N1 in a linear region between a non-conducting state (fully OFF) and conducting state (fully ON), which changes the capacitance of the negative path between the first and second terminals 101 and 102. More specifically, when the first transistor N1 is in a non-conducting state (e.g., when the first transistor N1 is in a cutoff region), the first transistor N1 comprises a relatively small parasitic capacitance (denoted herein as C_Off) that is connected in series with the capacitors C1 and C2, which reduces the effective capacitance of negative path ($C_{min}$ for the path) due to the small parasitic capacitance of the first transistor N1. On the other hand, when the first transistor N1 reaches a fully conducting state (e.g., when the first transistor N1 reaches saturation), the effective capacitance of the negative path is substantially based on the capacitances of the series connected capacitors C1 and C2 ($C_{max}$ for the path). For example, when C1=C2=C, the total capacitance of the negative path will be approximately ½C. When the first transistor N1 operates in a linear region, the effective capacitance of the negative path will transition in a range between $C_{min}$ to $C_{max}$ (for the path) based on the control voltage signal VCON_N.

Similarly, the control voltage signal VCON_P is applied to the second control terminal 112 to change the ON resistance (or channel resistance) of the second transistor N2 in a linear region between a non-conducting state (fully OFF) and conducting state (fully ON), which changes the capacitance of the positive path between the first and second terminals 101 and 102. More specifically, when the second transistor N2 is in a non-conducting state (e.g., when the second transistor N2 is in a cutoff region), the second transistor N2 comprises a relatively small parasitic capacitance that is connected in series with the capacitors C3 and C4, which reduces the total capacitance of positive path due to the small parasitic capacitance of the second transistor N2. On the other hand, when the second transistor N2 is in a conducting state, the total capacitance of the positive path is substantially based on the capacitances of the series connected capacitors C3 and C4. For example, when C3=C4=C, the total capacitance of the positive path will be approximately ½C. When the second transistor N2 operates in a linear region, the effective capacitance of the positive path will transition in a range between $C_{min}$ to $C_{max}$ (for the path) based on the control voltage signal VCON_P.

The first reference voltage VREF_N is applied to the first tuning terminal 121 to adjust/shift an effective threshold voltage of the first transistor N1 and thereby adjust the point at which the first transistor N1 transitions between a conducting state and a non-conducting state. Similarly, the second reference voltage VREF_P is applied to the second tuning terminal 122 to adjust/shift an effective threshold voltage of the second transistor N2 and thereby adjust the point at which the second transistor N2 transitions between a conducting state and a non-conducting state. In this regard, the first and second reference voltages VREF_N and VREF_P are utilized to set the effective threshold voltages of the respective first and second transistors N1 and N2. In addition, the first and second reference voltages VREF_N and VREF_P effectively set a common mode voltage ($V_{CM}$) for the differential control voltage signals VCON_N and VCON_P applied to the varactor 100. In some embodiments, the first and second reference voltages VREF_N and VREF_P comprise static voltages that can range in voltage value from a negative power supply voltage (e.g., 0V or GND) and a positive power supply voltage $V_{DD}$. In some embodiments, the first and second reference voltages VREF_N and VREF_P are generated using digital-to-analog (DAC) circuits that are implement by a calibration/tuning system.

By way of example, assume that VREF_N is set to 0V (GND), and VREF_P is set to $V_{DD}$ (e.g., $V_{DD}$=800 mV) In this instance, the common mode voltage will be (VREF_P–VREF_N)/2=($V_{DD}$–GND)/2=$V_{DD}$/2. Furthermore, in this instance, the transition between the conducting state and the non-conducting state of the first transistor N1 will occur at the actual threshold voltage of the first transistor N1, and the transition between the conducting state and the non-conducting state of the second transistor N2 will occur at the actual threshold voltage of the second transistor N2. If VREF_N is increased to a voltage (e.g., 100 mV) greater than 0V, the effective threshold voltage of the first transistor N1 will shift by the same amount. Similarly, if VREF_P is decreased to a voltage (e.g., $V_{DD}$–100 mV) which is less than $V_{DD}$, the effective threshold voltage of the second transistor N2 will shift accordingly.

As noted above, the control voltage signals VCON_N and VCON_P are used to adjust the capacitance of the varactor 100. In general, when the control voltage signal VCON_P increases, the capacitance of the varactor 100 decreases. On the other hand, when the control voltage VCON_N increases, the capacitance of the varactor 100 increases. In some embodiments, the control voltage signals VCON_N and VCON_P are generated by an analog control system (e.g., charge pump circuit) which is configured to adjust the capacitance of the varactor 100 for a given application. For example, in the context of an LC oscillator circuit (e.g., LC tank circuit in a VCO) having a capacitor C and inductor L connected in parallel, the capacitance C can be implemented using the varactor 100, wherein the total capacitance in the LC tank can be adjusted by changing the capacitance of the varactor 100. The oscillation frequency of the LC oscillator is generally expressed by:

$$f = \frac{1}{2\pi\sqrt{LC}},$$

wherein an increase in the capacitance C results in a decrease in the oscillation frequency, and wherein a decrease in the capacitance results in an increase in the oscillation frequency. In this regard, the control voltage signals VCON_N and VCON_P are utilized to tune the capacitance of the varactor 100 which, in turn, tunes the operating frequency of the LC oscillator of the VCO.

As noted above, the first and second reference voltages VREF_N and VREF_P are statically adjusted to tune the behavior of the varactor 100 to optimize it for certain properties (e.g., linearity, transition characteristics, etc.). The first and second reference voltages VREF_N and VREF_P can be individually set to any analog voltage level in the range [GND, $V_{DD}$]. In some embodiments, the first and second transistors N1 and N2 (and other transistors of other exemplary differential varactor devices as discussed herein) are biased to operate the triode region (or ohmic region).

The varactor 100 comprises a VVRTC structure which (i) enables differential control while optimizing the ON resistance of the first and second transistor devices N1 and N2 of the same type (e.g., N-type or P-type) in both the positive and negative control paths, (ii) supports means for controlling the gate-source biasing voltages of the first and second transistor devices N1 and N2, thus enabling the combination of two or more instances of a core VVRTC varactor structure with appropriately offset gate-source controlling voltages to form a composite linearized structure, and (iii) supports means for independently setting common mode and differential mode gains for a desired frequency control.

As noted above, it is desirable to implement a differential control scheme to tune the capacitance of a varactor device since a differential control scheme provides immunity to common mode noise. Typically, differential control of a varactor is implemented using complementary transistor pairs. For example, in the exemplary embodiment of FIG. 1, in a conventional implementation, the first and second transistors N1 and N2 would be complementary NFET and PFET devices in the control paths, with the first and second control terminals 111 and 112 coupled to the gate terminals of the respective NFET and PFET devices. However, such a conventional scheme can result in degraded performance as a result of poor matching between the NFET and PFET devices (e.g., mismatches between two types of transistors). The device mismatch can be balanced by relative rationing of the device sizes for a given technology, but even this approach does not resolve mismatching due to process variation.

The exemplary varactor embodiment as shown in FIG. 1 eliminates the use of complementary PFET and NFET devices in the VVRTC varactor framework by utilizing the same transistor type (or dopant type) for the first and second transistor devices N1 and N2 (e.g., NFET devices or PFET devices) operating as voltage variable resistor devices. To implement the same transistor type for the first and second transistors N1 and N2 operating and voltage variable resistor devices, as shown in FIG. 1, the second control terminal 112 is coupled to the first and second source/drain elements of the second transistor N2, while the second tuning terminal 122 is coupled to the gate of the second transistor N2. This is opposite to the negative control path in which the first tuning terminal 121 is coupled to the first and second source/drain elements of the first transistor N1, while the first control terminal 111 is coupled to the gate of the first transistor N1. The use of the same type of transistor devices for N1 and N2 allows for matching the ON resistances of the transistor devices N1 and N2, which provides symmetry in the tuning characteristics of the varactor 100, e.g., symmetry in the capacitance vs. control voltage characteristics for the positive and negative control paths of the varactor 100, and symmetry in the frequency vs. control voltage characteristics for the positive and negative control paths of the varactor 100 when used in the LC tank of a VCO, etc.

Figure 2:
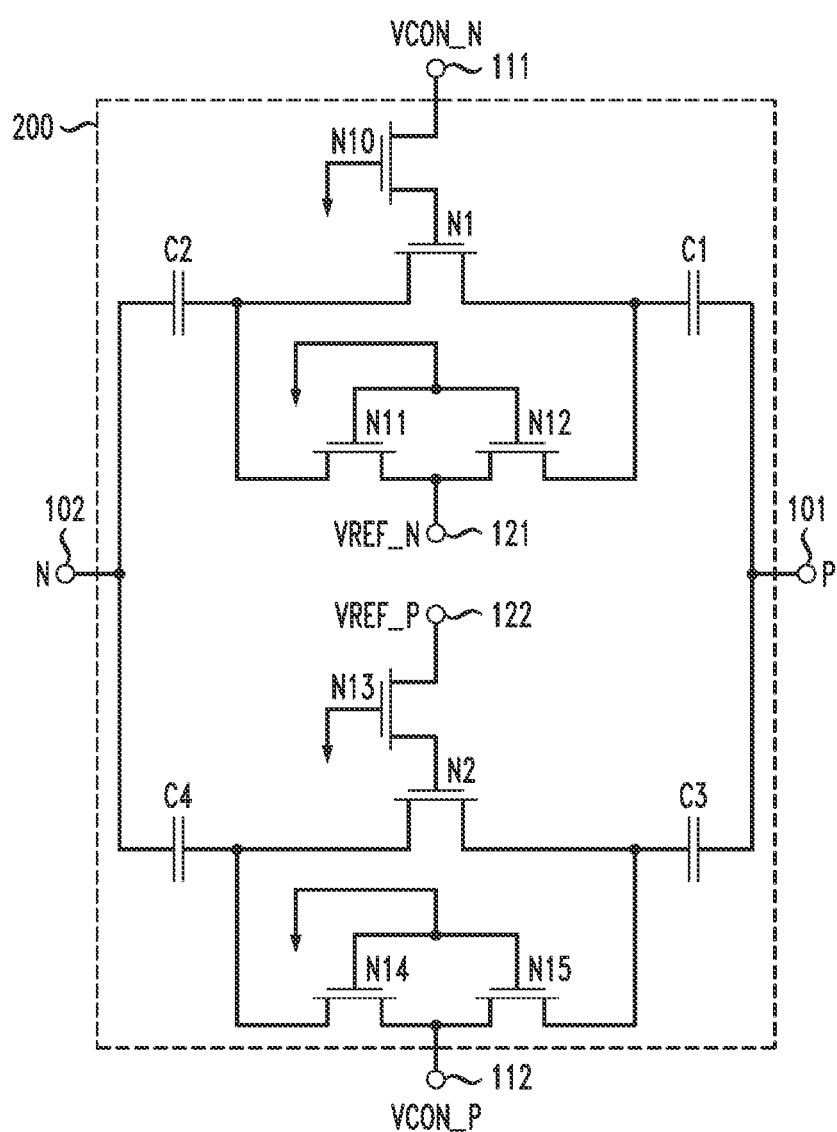
FIG. 2 schematically illustrates a variable capacitor device, according to another exemplary embodiment of the disclosure.

FIG. 2 schematically illustrates a variable capacitor device, according to another exemplary embodiment of the disclosure. More specifically, FIG. 2 schematically illustrates a voltage variable capacitor device 200 (or varactor 200) having a VVRTC circuit structure with differential control which is similar to voltage variable capacitor device 100 of FIG. 1, except that the resistors R1, R2, R3, R4, R5, and R6 are replaced with transistors N10, N11, N12, N13, N14, and N15, respectively. As shown in FIG. 2, the transistors N10, N11, N12, N13, N14, and N15 are configured to serve as high-impedance resistive elements, wherein gate terminals of the transistors N10, N11, N12, N13, N14, and N15 are connected to ground (GND) so that the transistors remain in a non-conducting (cut off) state. The transistors N10, N11, N12, N13, N14, and N15 comprise the same transistor type (e.g., N-type FET devices) and are made significantly small to serve as high impedance resistive elements within the operating frequency range of the given application which utilizes the varactor 200, which maintains a high quality factor of the varactor 200 with respect to the use of the varactor 200 in a resonator or oscillator circuit. The use of small FET devices as the resistive elements reduces the footprint of the varactor 200 (as compared to the varactor 100 of FIG. 1) and, thus, provides a more compact implementation in advanced semiconductor technologies. In other embodiments, the transistors N10, N11, N12, N13, N14, and N15 comprise P-type FET devices with gate terminals coupled to a $V_{DD}$ supply voltage so that the P-type FET devices are configured to remain in a non-conducting (cut off) state.

Figure 3:
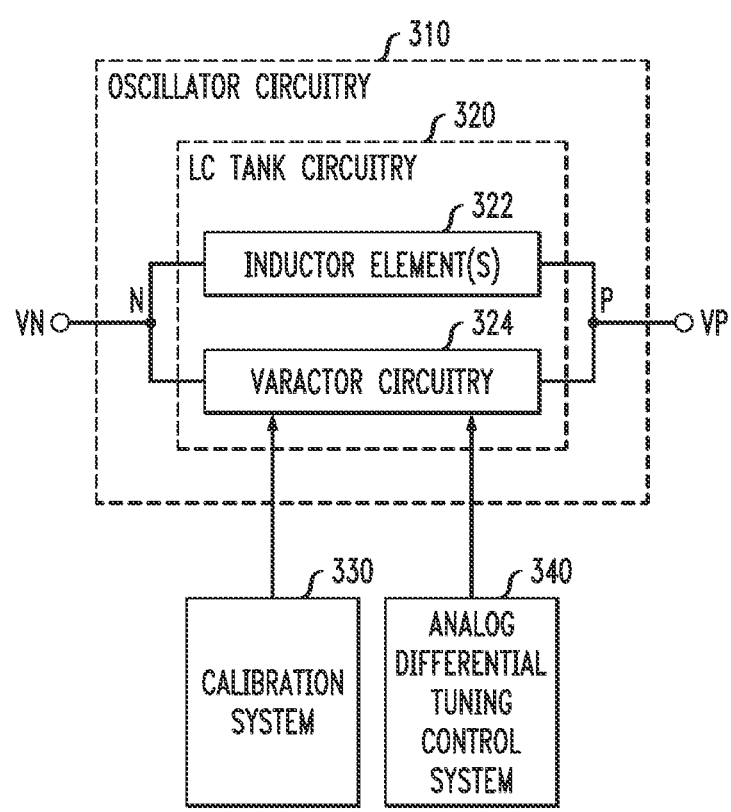
FIG. 3 schematically illustrates a system which is implemented using a variable capacitor device according to an exemplary embodiment of the disclosure.

FIG. 3 schematically illustrates a system 300 which can be implemented using a variable capacitor device according to an exemplary embodiment of the disclosure. The system 300 comprises oscillator circuitry 310 which comprises LC tank circuitry 320. The LC tank circuitry 320 comprises inductor elements 322 and varactor circuitry 324. The inductor elements 322 and the varactor circuitry 324 are connected in parallel to LC tank nodes P and N, which are connected to differential output terminals VP and VN. The system 300 further comprises a calibration system 330 and an analog differential tuning control system 340.

It is to be understood that the system 300 of FIG. 3 is meant to be a high-level representation of any type of system that utilizes a tunable oscillator which generates an output frequency as a function of a control input (e.g., control voltages), or any tunable circuit (e.g., low-noise amplifier, mixer, etc.), which utilizes one or more VVRTC varactor devices with differential control, as discussed herein. For example, the system 300 may comprise a communications system (wired or wireless) such as a receiver, transmitter, transceiver, etc., in which the oscillator circuitry 310 is utilized to generate local oscillator (LO) signals for mixer circuitry utilized for frequency modulation, I/Q modulation, etc. By way of further example, the system 300 may be a frequency synthesizer, or a phase-locked loop (PLL) system, etc.

Furthermore, the oscillator circuitry 310 may comprise any type of LC oscillator framework which utilizes an LC tank with a variable capacitance to tune the frequency output of the oscillator circuitry 310. For example, in some embodiments, the oscillator circuitry 310 comprises voltage-controlled oscillator (VCO) circuitry in which a control voltage signal (e.g., a differential control voltage signal) is used as a control input to tune the capacitance of the LC tank circuitry 320 and thereby vary the output frequency generated by the oscillator circuitry 310. In the LC tank circuitry 320, the variable capacitance is implemented using the varactor circuitry 324 which comprises a plurality of VVRTC varactors. The varactor circuitry 324 can be implemented using any of the exemplary embodiments discussed herein in conjunction with, e.g., FIGS. 1, 2, 7, 8, and 9.

The calibration system 330 is configured to calibrate the varactor circuitry 324 using techniques as discussed herein. The analog differential tuning control system 340 is configured to generate the control voltage signals (e.g., differential control voltage signals VCON_N and VCON_P) to adjust the capacitance of the varactor circuitry 324 in the LC tank circuitry 320 to tune the frequency output of the oscillator circuitry 310. In some embodiments, for a PLL implementation, the analog differential tuning control system 340 comprises a differential charge pump and loop filter circuit.

Figure 4:
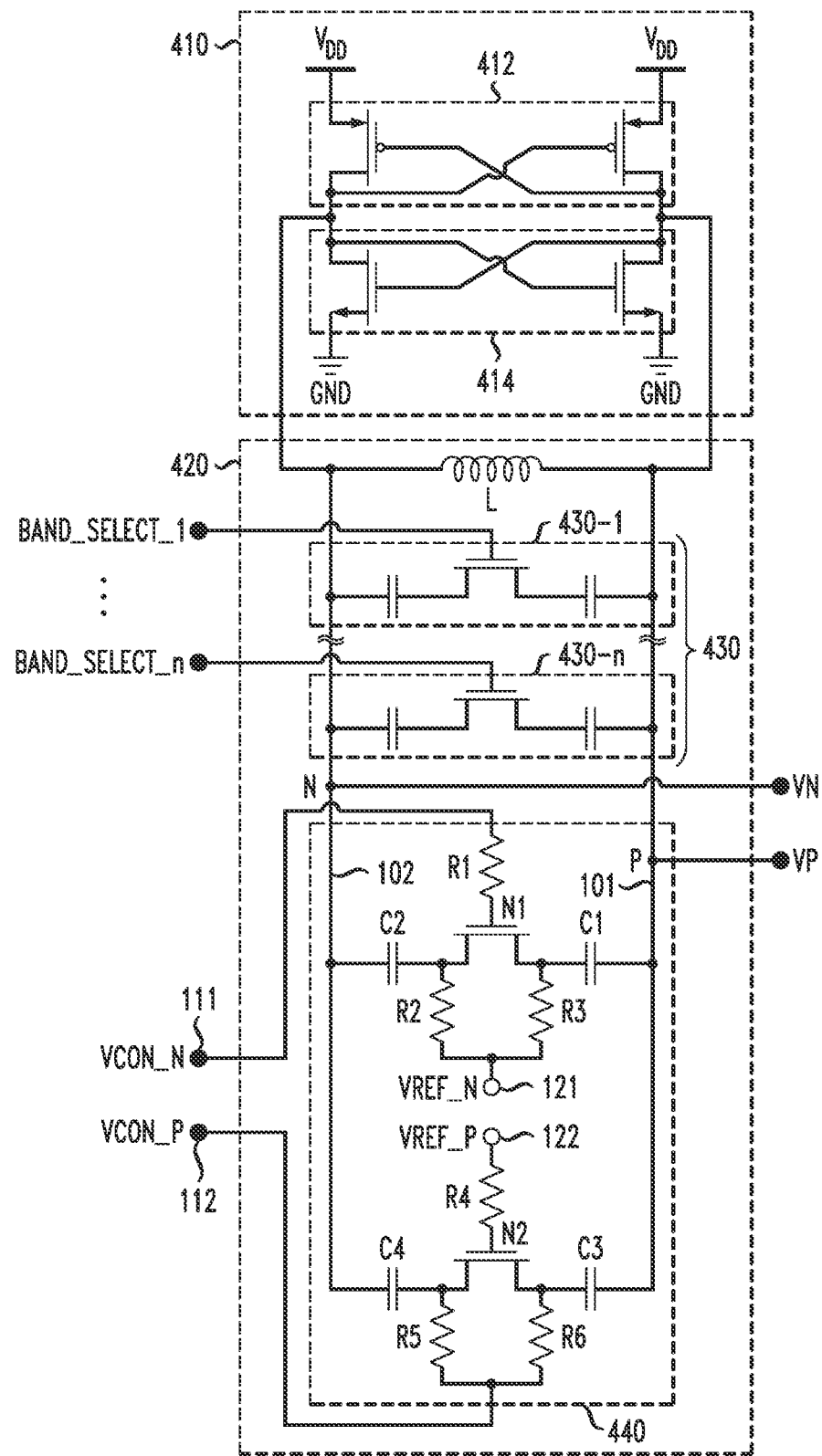
FIG. 4 schematically illustrates a voltage-controlled oscillator which is implemented using a variable capacitor device, according to an exemplary embodiment of the disclosure.

FIG. 4 schematically illustrates a voltage-controlled oscillator circuit which is implemented using a variable capacitor device according to an exemplary embodiment of the disclosure. In particular, FIG. 4 schematically illustrates a VCO circuit 400 which comprises a complimentary cross-coupled LC tank VCO framework. The VCO circuit 400 comprises a transconductance ($g_m$) cell 410, and an LC tank circuit 420. The transconductance cell 410 comprises a cross-coupled pair of PFET devices 412, and a cross-coupled pair of NFET devices 414. The transconductance cell 410 is configured to provide a negative resistance which, e.g., reduces current consumption and circuit losses and increases the Q-factor of the VCO circuit 400, as is known in the art. The LC tank circuit 420 is configured to set the oscillation frequency of the VCO circuit 400.

As schematically illustrated in FIG. 4, the LC tank circuit 420 comprises an inductor L, a varactor bank 430, and a varactor circuit 440, which are connected in parallel between LC tank nodes P and N. The varactor bank 430 comprises a plurality (n) of varactor segments 430-1, . . . , 430-n. For illustrative purposes, the varactor circuit 440 is shown in FIG. 4 to be implemented using the varactor 100 of FIG. 1. It is to be understood, however, that the varactor circuit 440 can be implemented using any of the exemplary VVRTC varactor circuit embodiments discussed herein in conjunction with, e.g., FIGS. 1, 2, 7, 8, and 9.

In the exemplary framework of the VCO circuit 400, coarse frequency tuning is achieved by applying a digital code (band_select code) to the varactor bank 430 to activate one or more of the varactor segments 430-1, . . . , 430-n. In particular, as shown in FIG. 4, each varactor segment 430-1, . . . , 430-n comprises a transistor device (e.g., NFET device) which is selectively activated by a respective band select control signal, Band_Select_1, . . . , Band_Select_n, to coarsely increase the capacitance of the LC tank circuit 420 and obtain a desired frequency band of operation of the VCO circuit 400. On the other hand, fine frequency tuning within a given frequency band is achieved by applying a differential control voltage signal (e.g., VCON_P, VCON_N) to the VVRTC varactor circuit 440 to adjust the capacitance of the VVRTC varactor circuit 440 and thereby fine tune the frequency output of the VCO circuit 400 to a target frequency within the selected frequency band.

For an LC VCO such as shown in FIG. 4, the oscillation frequency is generally expressed by:

$$f = \frac{1}{2\pi\sqrt{LC}},$$

wherein an increase in the capacitance C results in a decrease in the oscillation frequency, and wherein a decrease in the capacitance C results in an increase in the oscillation frequency. For the VCO circuit, an increase in control voltage (e.g., increase in differential voltage) increases the oscillating frequency, while a decrease in the control voltage decreases the oscillating frequency. In general, an ideal VCO circuit has an output frequency which is a linear function of the control voltage as follows: $f_{OUT} f_0 + K_{VCO} * V_{CON}$, where $f_0$ denotes the oscillation frequency at $V_{CON} = 0$, and $K_{VCO}$ denotes a gain of the VCO circuit.

For differential VCO which implements a differential varactor with a differential control voltage to adjust the capacitance of the differential varactor, the VCO circuit has an output frequency expressed as: $f_{OUT} = f_0 + K_{VCO\_DIFF} * V_{DIFF} + K_{VCO_{COM}} * V_{COM}$, where $V_{DIFF}$ denotes a differential control voltage applied to the differential varactor, $V_{COM}$ denotes a common mode voltage of the differential voltage $V_{DIFF}$, where $f_0$ denotes the oscillation frequency at $V_{DIFF} = 0$, $K_{VCO\_DIFF}$ denotes a differential VCO gain, and where $K_{VCO_{COM}}$ denotes a common mode VCO gain. In an ideal VCO circuit with an ideal differential varactor, the VCO circuit has a constant differential voltage gain (e.g., $K_{VCO\_DIFF}$=constant gain) within a target frequency tuning range, and common mode gain of zero (e.g., $K_{VCO_{COM}}$=0) within the target frequency tuning range. A common mode gain of zero serves to reject any common mode noise that would otherwise degrade the VCO jitter performance. In practice, however, the sharp turn-on characteristics of a VVRTC varactor can result in highly undesirable variability and non-linearity of $K_{VCO\_DIFF}$ within the desirable tuning range.

Figure 5A:
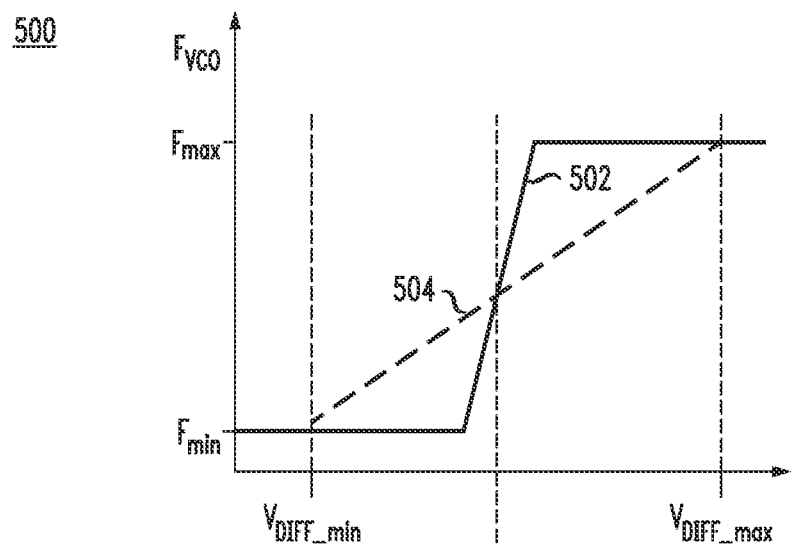
FIGS. 5A and 5B graphically illustrate ideal and exemplary actual representations of frequency and gain characteristics of a voltage-controlled oscillator which implements a varactor for continuous frequency tuning.
Figure 5B:
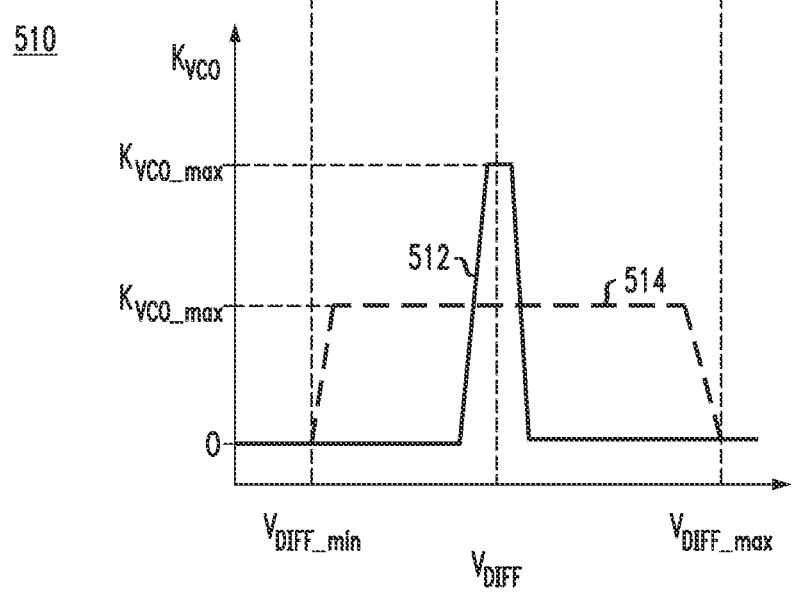

FIGS. 5A and 5B graphically illustrate ideal and exemplary actual representations of frequency and gain characteristics of a voltage-controlled oscillator which implements a varactor for continuous frequency tuning. More specifically, FIG. 5A depicts a graph 500 which shows VCO frequency (denoted $F_{VCO}$) as a function of a differential control voltage (denoted $V_{DIFF}$) applied to a differential varactor. In FIG. 5A, it is assumed that the VCO comprises (i) a frequency band of operation defined by a minimum oscillating frequency (denoted $F_{min}$) and a maximum oscillating frequency (denoted $F_{max}$) (providing a frequency tuning range of $F_{max} - F_{min}$), and (ii) a control voltage range defined by a minimum differential control voltage (denoted $V_{DIFF\_min}$) and maximum differential control voltage (denoted $V_{DIFF\_max}$), wherein the oscillating frequency $F_{VCO}$ increases as the differential control voltage $V_{DIFF}$ increases.

FIG. 5A illustrates an exemplary representation of a typical achieved frequency-to-differential control voltage transfer curve 502 which shows VCO frequency characteristics that can result by utilizing a single VVRTC varactor in the VCO circuit, due to the sharp turn-on characteristics of the FET devices of the VVRTC varactor. In this circumstance, there is a limited linear tuning range for the single VVRTC varactor. This is in contrast to an ideal frequency-to-differential control voltage transfer curve 504 which represents an ideal (and desirable) VCO frequency characteristic in which the linear tuning range covers the entire differential control voltage range from $V_{DIFF\_min}$ to $V_{DIFF\_max}$. In this regard, it is desirable to configure the VCO to be effectively tuned over the entire operating frequency range.

Furthermore, FIG. 5B depicts a graph 510 which shows VCO gain (denoted $K_{VCO}$) as a function of the differential control voltage $V_{DIFF}$ applied to a varactor with differential control, based on the frequency tuning range of $F_{max} - F_{min}$ and differential voltage range $V_{DIFF\_min}$ to $V_{DIFF\_max}$, as shown in FIG. 5A. More specifically, FIG. 5B illustrates an exemplary representation of a typical achieved gain-to-differential control voltage transfer curve 512 of a VCO based on the exemplary frequency-to-differential control voltage transfer curve 502 of FIG. 5A. The VCO gain $K_{VCO}$ (or VCO tuning gain) is measured in terms of volts per Hz (e.g., mV/MHz, mV/GHz, etc.), which represents a unit change in frequency given a unit change in the differential control voltage $V_{DIFF}$. As shown in FIG. 5B, the VCO gain $K_{VCO}$ is variable across the entire tuning range. This is in contrast to an ideal gain-to-differential control voltage transfer curve 514 (as shown in FIG. 5B), which represents an ideal (and desirable) VCO gain characteristic in which the VCO gain $K_{VCO}$ is essentially constant over the entire tuning range. In addition, due to the smaller slope of the ideal frequency-to-differential control voltage transfer curve 504 as compared to the slope of the frequency-to-differential control voltage transfer curve 502, the maximum $K_{VCO}$ for the ideal gain-to-differential control voltage transfer curve 514 is lower than the maximum $K_{VCO}$ for the gain-to-differential control voltage transfer curve 512.

Figure 6A:
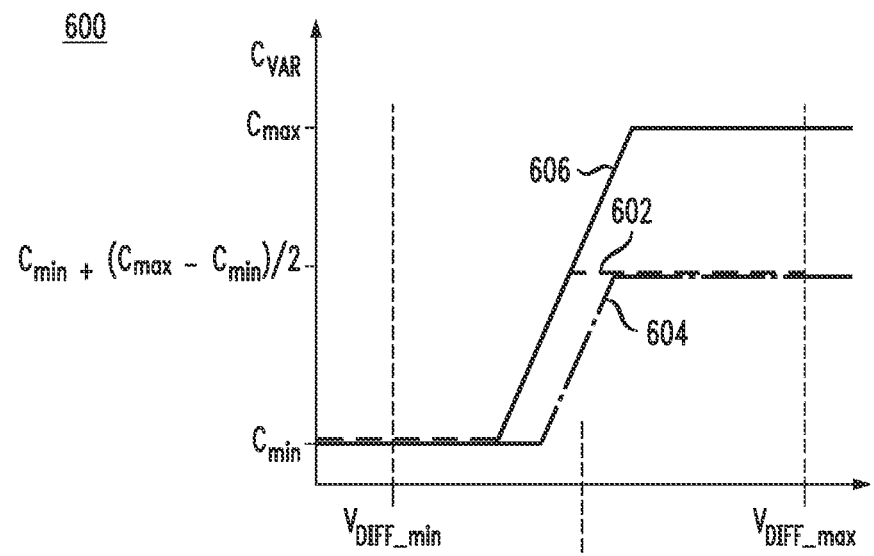
FIGS. 6A and 6B schematically illustrate a linearization process that is implemented by adding two or more variable capacitor devices in parallel and changing/shifting a capacitance-to-differential control voltage transfer characteristics of the variable capacitor device to enhance tuning linearity and reduce gain variation over a given tuning range, according to an exemplary embodiment of the disclosure.
Figure 6B:
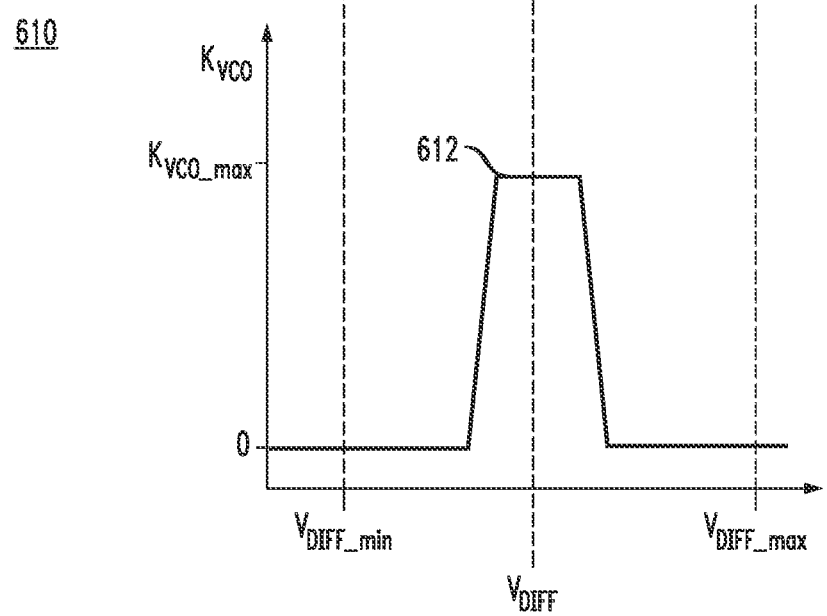

In accordance with exemplary embodiments of the disclosure, increased linearity in the frequency-to-differential control voltage response of an oscillator (e.g., VCO) over the target tuning range of the oscillator, as well as reduced variation in the oscillator gain over the target tuning range, is achieved by adding two or more VVRTC varactor devices in parallel and changing/shifting the capacitance-to-differential control voltage characteristics of the two or more VVRTC varactor devices. FIGS. 6A and 6B schematically illustrate a linearization process that is implemented by adding two or more VVRTC varactor devices in parallel and changing/shifting the capacitance-to-differential control voltage characteristics of such varactor devices to enhance tuning linearity and reduce gain variation over within a given tuning range, according to an exemplary embodiment of the disclosure.

More specifically, FIG. 6A graphically illustrates the varactor capacitance-to-differential control voltage transfer characteristics of two differential varactor devices, which are connected in parallel in a tank circuit of a VCO, to achieve a wider range of linearity over the tuning range of the VCO. More specifically, FIG. 6A depicts a graph 600 which shows varactor capacitance (denoted $C_{VAR}$) as a function of a differential control voltage (denoted $V_{DIFF}$) applied to two parallel connected VVRTC varactor devices with differential control. In FIG. 6A, a first curve 602 schematically illustrates the capacitance-to-differential control voltage transfer characteristics of a first VVRTC varactor device with differential control, and a second curve 604 schematically illustrates the capacitance-to-differential control voltage transfer characteristics of a second VVRTC varactor device with differential control.

FIG. 6A illustrates a linearization technique in which the capacitance-to-differential control voltage transfer curves 602 and 604 are shifted relative to each other and then combined to provide an aggregate capacitance-to-differential control voltage transfer curve 606 which exhibits an overall more linearized capacitance-to-differential control voltage response of the VVRTC varactor circuitry which implements the two parallel-connected VVRTC varactor devices having differential control. In this regard, the combined capacitor-to-differential control voltage characteristic responses of multiple parallel-connected differential varactor devices results in an improved frequency-to-differential control voltage response of the VCO, and thus, more linearity in the tuning of the VCO over the target tuning range of the VCO.

Furthermore, FIG. 6B depicts a graph 610 which shows VCO gain $K_{VCO}$ as a function of the differential control voltage $V_{DIFF}$ applied to the differential varactor circuit having two parallel connected differential varactor devices, based on the capacitor-voltage characteristics of FIG. 6A. More specifically, FIG. 6B schematically illustrates a gain-to-differential control voltage curve 612 which results from the aggregate capacitance-to-differential control voltage transfer curve 606 of FIG. 6A. As shown in FIG. 6B, the gain-to-differential control voltage curve 612 of the VCO exhibits reduced gain variation over the target tuning range, as compared to the gain-to-differential control voltage curve 512 of FIG. 5B. Linearization techniques according to exemplary embodiments of the disclosure will now be discussed in further detail with regard to, e.g., FIGS. 7, 8, and 9.

Figure 7:
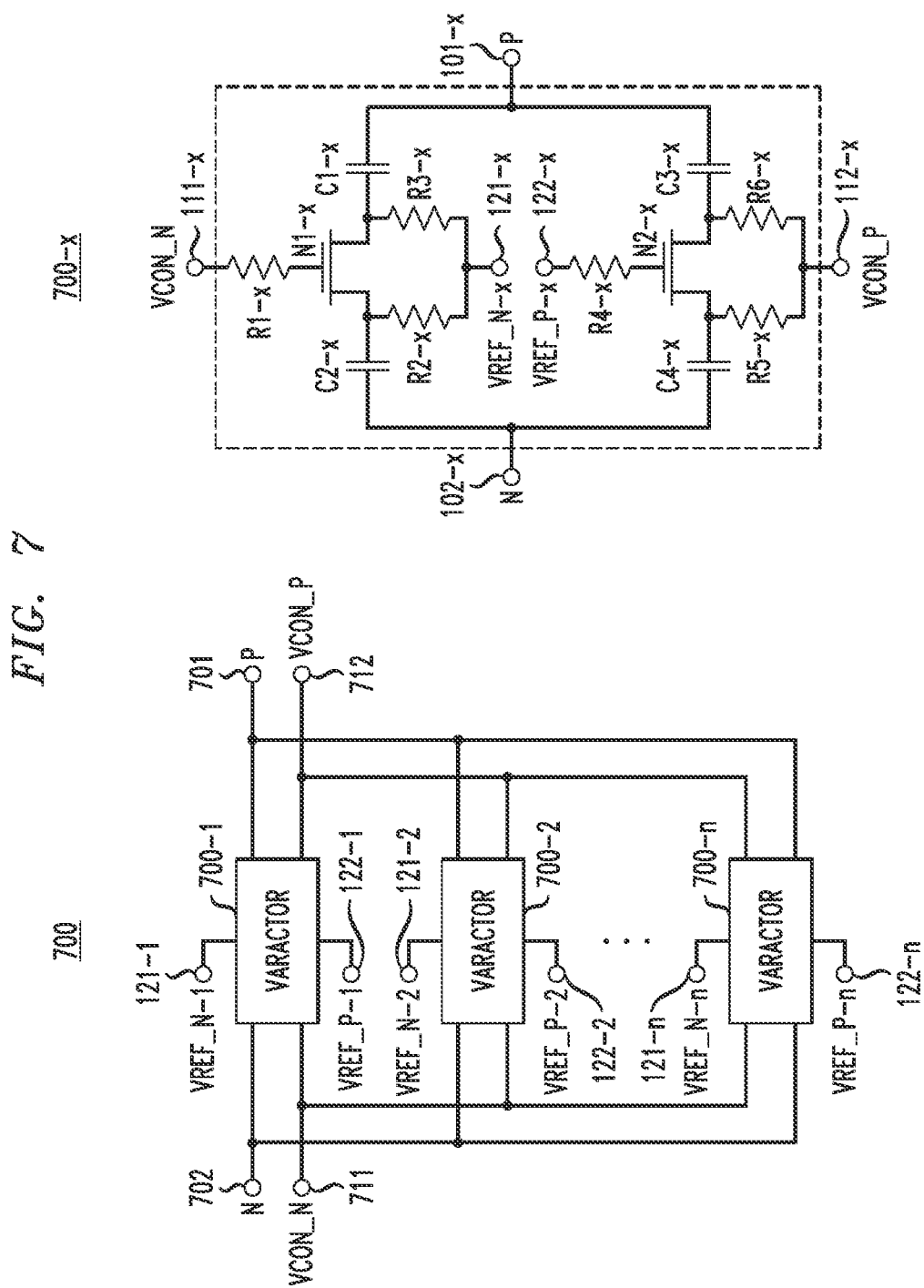
FIG. 7 schematically illustrates a variable capacitor circuit, according to another exemplary embodiment of the disclosure.

FIG. 7 schematically illustrates a variable capacitor circuit, according to another exemplary embodiment of the disclosure. More specifically, FIG. 7 schematically illustrates a VVRTC varactor circuit 700 comprising a plurality (n) of VVRTC varactor devices 700-1, 700-2, . . . , 700-n connected in parallel to a first terminal 701 (or positive P terminal) and a second terminal 702 (or negative N terminal) of the VVRTC varactor circuit 700. The first and second terminals 701 and 702 serve as common input/output (I/O) terminals for the VVRTC varactor devices 700-1, 700-2, . . . , 700-n to connect to, e.g., tank nodes P and N of a VCO. In addition, the VVRTC varactor circuit 700 comprises first and second control terminals 711 and 712, which serve as common control voltage terminals to apply the differential control voltage signals VCON_N and VCON_P, respectively, to the VVRTC varactor devices 700-1, 700-2, . . . , 700-n.

Moreover, the VVRTC varactor circuit 700 comprises a plurality of independent tuning terminals coupled to respective ones of the VVRTC varactor devices 700-1, 700-2, . . . , 700-n. In particular, as shown in FIG. 7, the first VVRTC varactor device 700-1 comprises a first tuning terminal 121-1 and a second tuning terminal 122-1 to receive a first reference voltage VREF_N-1 and a second reference voltage VREF_P-1, respectively, for tuning certain operating characteristics of the first VVRTC varactor device 700-1. In addition, the second VVRTC varactor device 700-2 comprises a first tuning terminal 121-2 and a second tuning terminal 122-2 to receive a first reference voltage VREF_N-2 and a second reference voltage VREF_P-2, respectively, for tuning certain operating characteristics of the second VVRTC varactor device 700-2. Moreover, the $n^{th}$ VVRTC varactor device 700-n comprises a first tuning terminal 121-n and a second tuning terminal 122-n to receive a first reference voltage VREF_N-n and a second reference voltage VREF_P-n, respectively, for tuning certain operating characteristics of the $n^{th}$ VVRTC varactor device 700-n.

The VVRTC varactor devices 700-1, 700-2, . . . , 700-n can be implemented using any of the exemplary VVRTC varactor architectures with differential control as shown in, e.g., FIG. 1, 2, 8, or 9. For illustrative purposes, FIG. 7 schematically illustrates an exemplary VVRTC varactor device 700-x which can be used to implement each of the parallel-connected VVRTC varactor devices 700-1, 700-2, . . . , 700-n of the VVRTC varactor circuit 700. Each VVRTC varactor device 700-x comprises respective I/O terminals 101-x and 102-x, differential control terminals 111-x and 111-2, tuning terminals 121-x and 122-x, transistors N1-x and N2-x, capacitors C1-x, C2-x, C3-x, and C4-x, and resistive elements R1-x, R2-x, R3-x, R4-x, R5-x, and R6-x, wherein each VVRTC varactor device 700-x is the same or similar in structure and operation to the varactor device 100 of FIG. 1, the details of which will not be repeated.

In some embodiments, the linearization of frequency tuning characteristics of a VCO is achieved by applying a different (offset) set of tuning voltage VREF_N-x, VREF_P-x pairs to each of the VVRTC varactor devices 700-1, 700-2, . . . , 700-n, yielding different offsets in the transfer characteristics of each VVRTC varactor device 700-1, 700-2, . . . , 700-n. For example, as noted above, the tuning reference voltages VREF_N-x and VREF_P-x applied to a given VVRTC varactor device 700-x enables a shift of the effective threshold voltages for the first and second transistors N1-x and N2-x (which control the voltage-variable ON resistances in the control paths), which results in a shift of the capacitance-to-voltage transfer characteristics of the given VVRTC varactor device 700-x. By shifting the capacitance-to-voltage response characteristics of two or more of the VVRTC varactor devices 700-1, 700-2, . . . , 700-n relative to each other, the different (offset) capacitance-to-voltage responses of the two or more of the VVRTC varactor devices 700-1, 700-2, . . . , 700-n are essentially combined to provide an aggregate capacitance-to-voltage response for the VVRTC varactor circuit 700 (such as shown schematically illustrated in FIG. 6A) which, as a whole, exhibits an overall more linearized capacitance-to-voltage response over a wider range of differential control voltages within the tuning range of the VCO. In addition, as explained above in conjunction with FIG. 6B, the linearization serves to reduce the variation in the differential gain of the VCO over the target tuning range.

Another approach to achieve linearization would be to design the VVRTC varactor devices 700-1, 700-2, . . . , 700-n such that the transistor pair N1-x and N2-x for each capacitor varactor device 700-x has a different threshold voltage. For example, the transistors N1-1 and N2-1 of the VVRTC varactor device 700-1 can have a first threshold voltage Vth-1, the transistors N1-2 and N2-2 of the VVRTC varactor device 700-2 can have a second threshold voltage Vth-2, and the transistors N1-n and N2-n of the VVRTC varactor device 700-n can have a threshold voltage Vth-n, wherein Vth-1<Vth-2<Vth-n, etc. However, this approach of varying Vth alone can be problematic for various reasons. For example, for small FET devices, due to process variations and mismatches, it is difficult to construct FET devices with different threshold voltages, especially when the ΔVth needed for the given application (e.g., 100 mV) is relativity small.

Advantageously, the use of the different tuning reference voltages VREF_N-x and VREF_P-x applied to different VVRTC varactor devices 700-x allows the effective threshold voltages for the first and second transistors N1-x and N2-x of a given VVRTC varactor device 700-x to be shifted/adjusted in a controlled manner, independent of the FET technology and device mismatches. In addition, the use of the tuning reference voltages VREF_N-x and VREF_P-x allows the effective threshold voltages of the first and second transistors N1-x and N2-x of a given VVRTC varactor device 700-x to be shifted/adjusted in small increments (e.g., 100 mV) over substantially an entire range of given supply voltage $V_{DD}$.

In other embodiments, the different tuning reference voltages VREF_N-x and VREF_P-x applied to the different VVRTC varactor devices 700-x can be used in conjunction with designing the first and second transistors N1-x and N2-x of different VVRTC varactor devices 700-x to have different threshold voltages. In this instance, coarse adjustment can be realized using the different threshold voltages of the FET devices, while the tuning reference voltages VREF_N-x and VREF_P-x can be utilized to fine tune the operating characteristics of the different VVRTC varactor devices 700-x to account for device mismatches, etc.

The exemplary linearization techniques achieved through varying the capacitance-voltage transfer characteristics of the first and second transistors N1-x and N2-x of the different VVRTC varactor devices 700-x using different sets (offset) of the tuning reference voltage pairs VREF_N-x and VREF_P-x applied to the tuning terminals 121-x and 122-x can lead to changing the ON resistance of the first and second transistors N1-x and N2-x, as well as changing the effective capacitance that is connected to the tank circuitry when the control is in the OFF state. In particular, in the OFF state, the C_Off of the first and second transistors N1-x and N2-x can be significantly different for different shifts in the effective threshold voltages of the first and second transistors N1-x and N2-x, which results from changing the tuning voltages VREF_N-x and VREF_P-x. In this regard, it is desirable to maintain the same impedance of the first and second transistors N1-x and N2-x (e.g., C_Off) when the first and second transistors N1-x and N2-x are in a non-conducting state (OFF state) irrespective of the shifted effective threshold voltages of the first and second transistors N1-x and N2-x.

In some embodiments, with regard the exemplary varactor framework of FIG. 7, the variation in the OFF impedance of the first and second transistors N1-x and N2-x in the different VVRTC varactor devices 700-x can be mitigated by, e.g., changing the transistor width of the first and second transistors N1-x and N2-x and/or the capacitance of the capacitors C1-x, C2-x, C3-x and C4-x in the different VVRTC varactor devices 700-2, . . . , 700-n, relative to the transistor widths of the first and second transistors N1-1 and N2-1 and the capacitance values of the capacitors C1-1, C2-1, C3-1 and C4-1, of the first VVRTC varactor 700-1. However, for FinFET technologies where the NFET width is coarsely quantized, adjusting relative transistor widths for the first and second transistors N1-x and N2-x may not be accurate enough (e.g., not provide the requisite small changes in transistor widths need for proper tuning).

Further, in some embodiments, the variation in the OFF impedance of the first and second transistors N1-x and N2-x in the different VVRTC varactor devices 700-x is mitigated by adding resistive elements (e.g., voltage variable resistive elements) in parallel with the first and second transistors N1-x and N2-x in the different segments of VVRTC varactor devices 700-x. The resistive elements provide a tunable resistive degradation of the first and second transistors N1-x and N2-x when such transistors are in an OFF mode. The use of the tunable resistive degradation in the different VVRTC varactor devices 700-x is configured to ensure that the first and second transistors N1-x and N2-x in the different VVRTC varactor devices 700-x have the same or substantially the same impedance (e.g., C_Off) when the first and second transistors N1-x and N2-x are in an OFF state, irrespective of the shifted threshold voltages of the first and second transistors N1-x and N2-x across the different VVRTC varactor devices 700-x due to different (offset) tuning reference voltage pairs VREF_N-x and VREF_P-x applied to the tuning terminals 121-x and 122-x. Exemplary embodiments of utilizing tunable degenerative resistance to adjust the OFF impedance of the first and second transistors N1-x and N2-x will now be discussed in further detail in conjunction with FIGS. 8 and 9.

Figure 8:
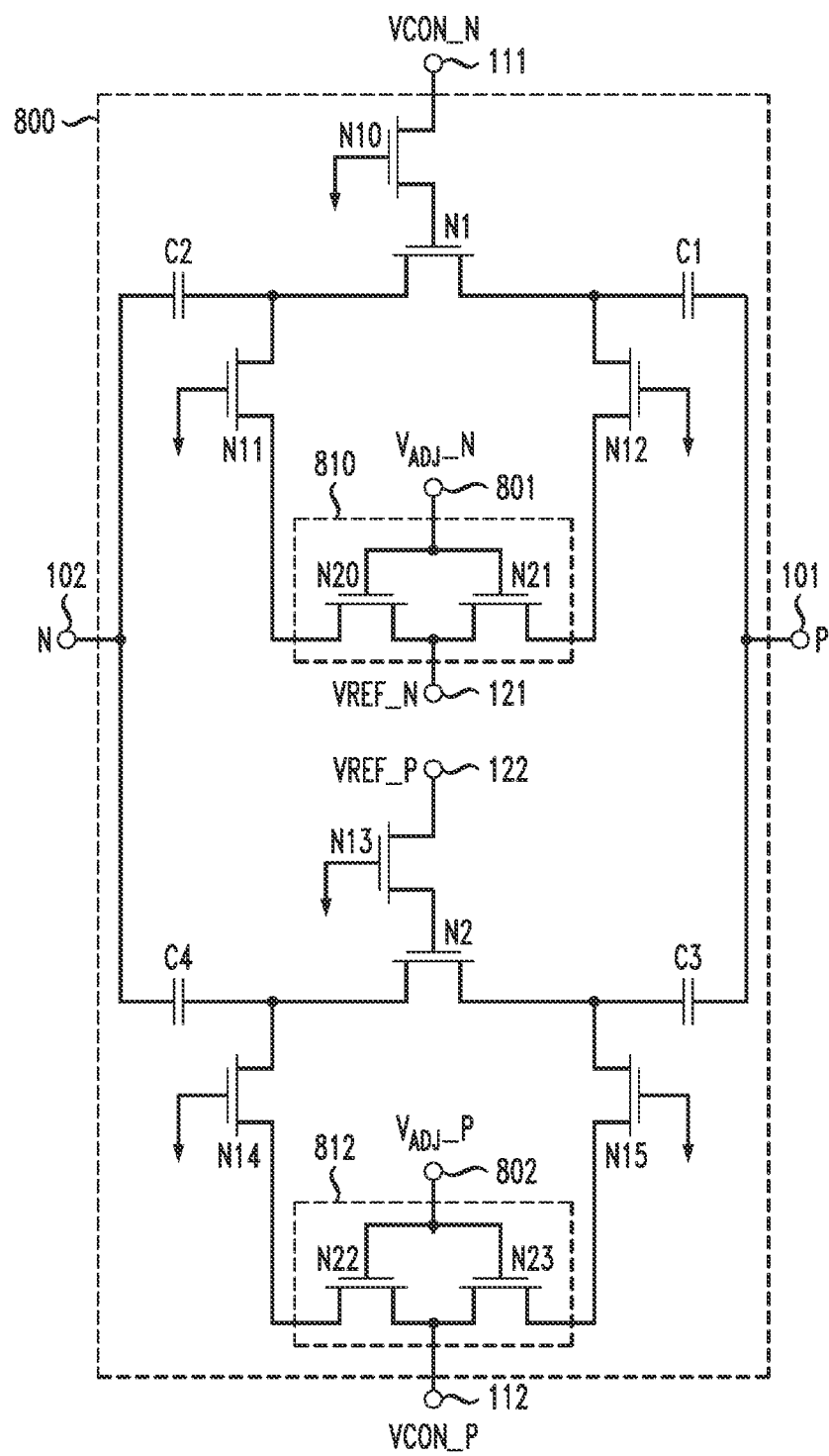
FIG. 8 schematically illustrates a variable capacitor device, according to another exemplary embodiment of the disclosure.

For example, FIG. 8 schematically illustrates a variable capacitor device, according to another exemplary embodiment of the disclosure. More specifically, FIG. 8 schematically illustrates a variable capacitor device 800 (or varactor 800) having a VVRTC circuit structure in which resistive elements are utilized to adjust the effective impedance of transistors of the varactor 800. The varactor 800 comprises a VVRTC circuit structure with differential control, which is similar to varactor 200 of FIG. 2, except that the varactor 800 comprises additional tuning terminals 801 and 802, and resistive elements 810 and 812.

In particular, the resistive element 810 comprises serially connected transistors N20 and N21, which have gate terminals commonly connected to the tuning terminal 801. The tuning terminal 801 is configured to receive an analog tuning voltage $V_{ADJ\_}N$ (or $V_{ADJ\_}Nx$ for the given varactor segment x). In addition, the resistive element 812 comprises serially connected transistors N22 and N23, which have gate terminals that are commonly connected to the tuning terminal 802. The tuning terminal 802 is configured to receive an analog tuning voltage $V_{ADJ\_}P$ (or $V_{ADJ\_}Px$ for the given varactor segment x). The resistive element 810 is connected in parallel with the first transistor N1, and the tunable resistive element 812 is connected in parallel with the second transistor N2. In operation, the effective resistance of the first and second transistors N1 and N2 can tuned by applying the tuning voltages $V_{ADJ\_}N$ and $V_{ADJ\_}P$ to the respective tuning terminals 801 and 802 to adjust the ON resistance of the serially connected transistors N20 and N21 of the resistive element 810, and the ON resistance of the serially connected transistors N22 and N23 of the resistive element 812. It is to be noted that transistors N11, N12, N14, and N15 are equivalent to fixed bias resistors which are utilized to provide a minimum bias resistance. In an alternative embodiment, the transistors N11, N12, N14, and N15 can be removed, and the transistor pairs N20/N21 and N22/N23 are connected directly to the source/drain terminals of the transistors N1 and N2, respectively. In such embodiments, the minimum bias resistance is controlled by limiting the voltage range for $V_{ADJ\_}N$ and $V_{ADJ\_}P$.

When the varactor 800 is utilized to implement the VVRTC varactor devices 700-1, 700-2, ..., 700-n (or generally, 700-x) in the exemplary embodiment of FIG. 7, the respective analog tuning voltages $V_{ADJ\_}N$-x and $V_{ADJ\_}P$-x can be adjusted based on the shifted effective threshold voltages of the first and second transistors N1-x and N2-x that are obtained by applying different tuning reference voltages VREF_N-x and VREF_P-x to the different VVRTC varactor devices 700-x. Furthermore, in some embodiments, when the varactor 800 is utilized to implement the VVRTC varactor devices 700-1, 700-2, ..., 700-n (or generally, 700-x) in the exemplary embodiment of FIG. 7, the capacitance values of the capacitors C1-x, C2-x, C3-x, and C4-x in the different varactor devices 700-x can be tuned differently in the different varactor devices 700-x to ensure that the effective OFF impedance (e.g., C_Off) is substantially the same for all varactor devices 700-x.

Figure 9:
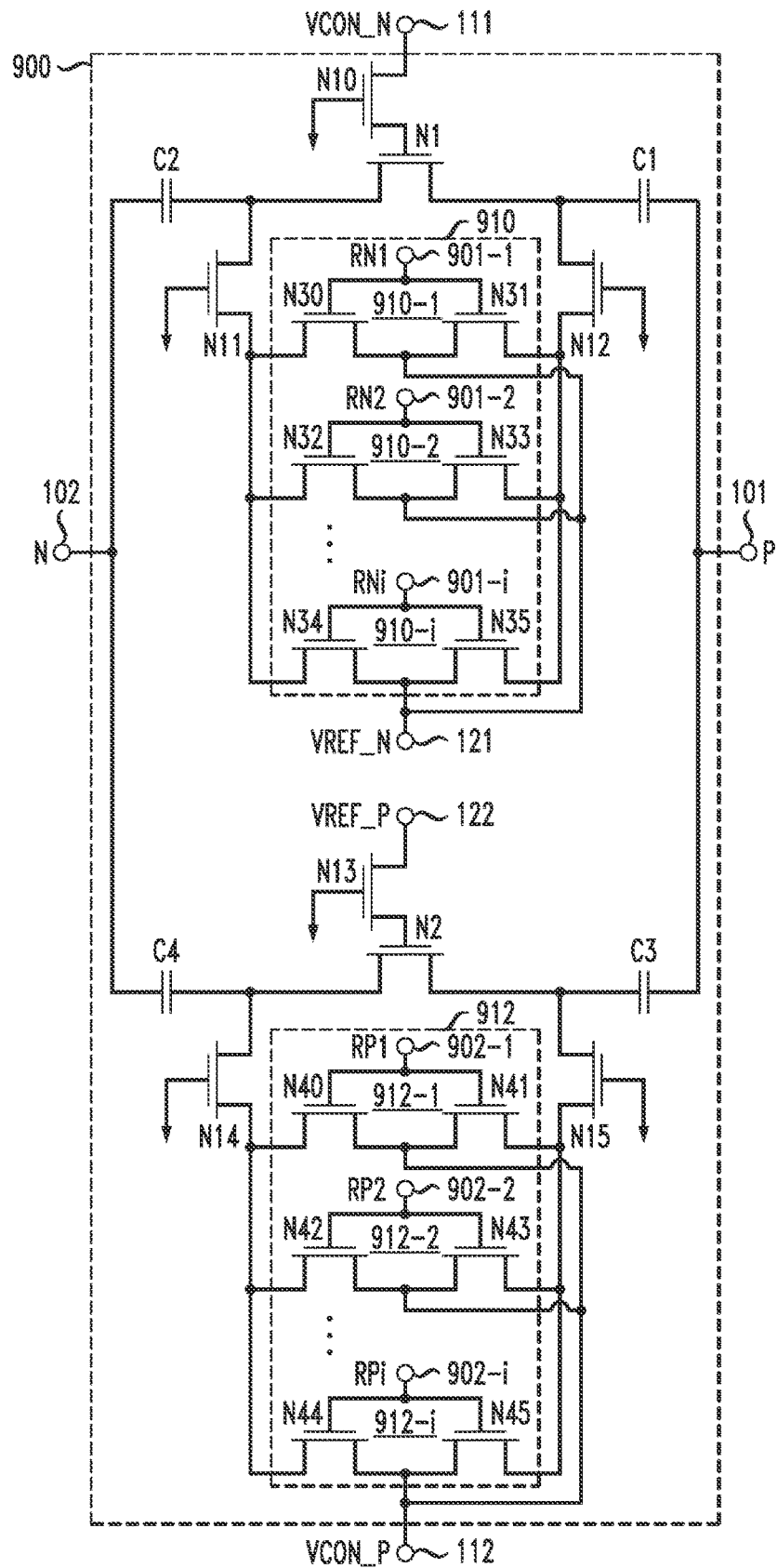
FIG. 9 schematically illustrates a variable capacitor device, according to another exemplary embodiment of the disclosure.

FIG. 9 schematically illustrates a variable capacitor device, according to another exemplary embodiment of the disclosure. More specifically, FIG. 9 schematically illustrates a variable capacitor device 900 (or varactor 900) having a VVRTC circuit structure in which tunable resistive elements are utilized to adjust the effective impedance of transistors of the varactor 900. The varactor 900 is similar to the varactor 800 of FIG. 8, except that the varactor 900 implements first and second resistive element banks 910 and 912 having multiple parallel connected resistive elements which are digitally controlled to adjust the effective OFF impedance (e.g., C_Off) of the first and second transistors N1 and N2.

More specifically, as shown in FIG. 9, the first resistive element bank 910 comprises a plurality of resistive elements 910-1, 910-2, ..., 910-i that are connected in parallel to the first transistor N1, and a plurality of digital control signal terminals 901-1, 901-2, ..., 901-i. The resistive element 910-1 comprises serially connected transistors N30 and N31 which have gate terminals that are commonly connected to the digital control signal terminal 901-1. The resistive element 910-2 comprises serially connected transistors N32 and N33 which have gate terminals that are commonly connected to the digital control signal terminal 901-2. The resistive element 910-i comprises serially connected transistors N34 and N35 which have gate terminals that are commonly connected to the digital control signal terminal 901-i.

Similarly, the second resistive element bank 912 comprises a plurality of resistive elements 912-1, 912-2, ..., 912-i that are connected in parallel to the second transistor N2, and a plurality of digital control signal terminals 902-1, 902-2, ..., 902-i. The resistive element 912-1 comprises serially connected transistors N40 and N41 which have gate terminals that are commonly connected to the digital control terminal 902-1. The resistive element 912-2 comprises serially connected transistors N42 and N43 which have gate terminals that are commonly connected to the digital control signal terminal 902-2. The resistive element 912-i comprises serially connected transistors N44 and N45 which have gate terminals that are commonly connected to the digital control signal terminal 902-i.

The digital control signal terminals 901-1, 901-2, ..., 901-i of the first resistive element bank 910 are configured to receive as input an i-bit digital signal, RN1, RN2, ..., RNi, to selectively activate one or more of the resistive elements 910-1, 910-2, ..., 910-i of the first resistive element bank 910, as needed, to adjust the effective impedance of the first transistor N1. Similarly, the digital control signal terminals 902-1, 902-2, ..., 902-i of the second resistive element bank 912 are configured to receive as input an i-bit digital signal, RP1, RP2, ..., RPi, to selectively activate one or more of the resistive elements 912-1, 912-2, ..., 912-i of the second resistive element bank 912, as needed, to adjust the effective impedance of the second transistor N2. The embodiment of FIG. 9 allows for modifying the effective resistance to the control nodes and, thus, adjustment of the C_Off presented to the resonant tank.

In some embodiments, the first resistive element bank 910 can be configured such that the resistive elements 910-1, 910-2, ..., 910-i have (i) a same resistance R when activated (non-weighted resistance values), or (ii) weighed resistance values (e.g., the first resistive element 910-1 has resistance R, the second resistive element 910-2 has resistance of R×2, the $i^{th}$ resistive element 910-i has a resistance R×i). The same applies for the resistive elements 912-1, 912-2, ..., 912-i of the second resistive element bank 912.

It is to be noted that in the exemplary embodiment of FIG. 9, when the transistors N30-N35 and N40-N45 are turned on, the equivalent resistance can be too small, therefore the transistors N11, N12, N14 and N15 (equivalent to fixed bias resistors) are utilized to provide a minimum bias resistance. Depending on the technology used and relative transistor sizes for transistors N1 and N2, the transistors N11, N12, N14, and N15 may be needed to provide a fixed bias impedance.

It is to be noted that the exemplary embodiment of FIG. 8 provides an analog approach of using tunable resistive elements which are controlled by analog signals to adjust the effective capacitance (e.g., C_off) of a VVRTC varactor device, while FIG. 9 provides a digital approach of using tunable resistive elements which are controlled by digital signals to adjust the effective capacitance (e.g., C_off) of a VVRTC varactor device. In other embodiments, the analog and digital schemes of FIGS. 8 and 9 can be combined to provide both analog and digital tuning of the resistive elements.

Figure 10:
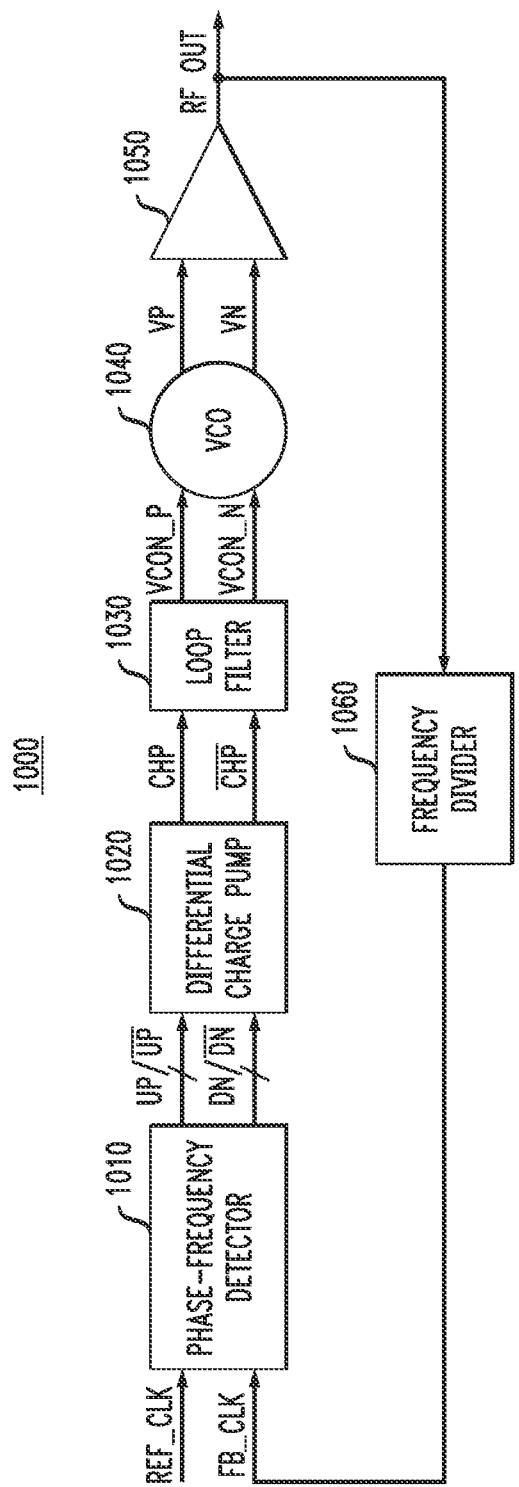
FIG. 10 schematically illustrates a phase-locked loop system comprising a voltage-controlled oscillator which is implemented using a variable capacitor device with differential control, according to an exemplary embodiment of the disclosure.

FIG. 10 schematically illustrates a phase-locked loop system comprising a voltage-controlled oscillator which is implemented using VVRTC varactor devices with differential control, according to an exemplary embodiment of the disclosure. In particular, FIG. 10 schematically illustrates a PLL system 1000 which comprises PLL circuitry such as a phase-frequency detector 1010, a differential charge pump 1020, a loop filter 1030, a VCO 1040, an output buffer 1050, and a feedback path comprising a frequency divider 1060. The PLL system 1000 is a closed-loop control system that is configured to compare the phase of a reference clock signal REF_CLK (which has a reference frequency $f_{REF}$), to the phase of a feedback clock signal FB_CLK which corresponds to a radio frequency (RF) output signal RF_OUT at the output of the PLL system 1000, and to tune the VCO 1040 so that the phase of RF_OUT is locked to the phase of REF_CLK. The RF output signal RF_OUT has a frequency that is equal to the output frequency ($f_{VCO}$) of the VCO 1040.

In some embodiments, the PLL system 1000 comprises an integer-N PLL system in which the frequency divider 1060 in the feedback loop divides the frequency of RF_OUT (i.e., the VCO output frequency $f_{VCO}$) by a division ratio, N, so that the VCO output frequency $f_{VCO}$ is an integer N multiple of the reference frequency $f_{REF}$ of REF_CLK, i.e., $f_{VCO}=N \times f_{REF}$. In other embodiments, the PLL system 1000 comprises a fractional-N PLL system in which the frequency divider 1060 in the feedback loop divides the output frequency $f_{VCO}$ of RF_OUT by a non-integer multiple of the reference frequency $f_{REF}$ of REF_CLK, as follows: $f_{VCO}=(N+k/m) \times f_{REF}$, where k and M are integers. The parameter M is fractional modulus which provides a measure of the fractionality that a fractional-N PPL can provide, while the parameter k can be any integer value between 0 and M.

In some embodiments, as shown in FIG. 10, the PLL system 1000 comprises differential interfaces between (i) the phase-frequency detector 1010 and the differential charge pump 1020, (ii) the differential charge pump 1020 and loop filter 1030, (iii) the loop filter 1030 and the VCO 1040, and between (iv) the VCO 1040 and the output buffer 1050. In some embodiments, the output buffer 1050 comprises a differential-to-differential buffer amplifier in which case the RF_OUT signal comprises a differential signal. In some embodiments, the output buffer 1050 comprises a differential-to-single ended buffer amplifier in which case the RF_OUT signal comprises a single-ended signal. It is to be noted that the phase-frequency detector 1010, the differential charge pump 1020, the loop filter 1030, the output buffer 1050, and the frequency divider 1060 can be implemented using various types of conventional or state of the art circuit architectures which are suitable for the given application. Further, the VCO 1040 can be implemented using any suitable VCO framework which implements the exemplary VVRTC varactor devices and circuits as disclosed herein.

While the operation of PLL systems is well known to those of ordinary skill in the art, a brief description of the operation of the PLL system 1000 of FIG. 10 will now be provided for illustrative purposes. In normal operation, the phase-frequency detector 1010 is configured to compare arriving edges of the reference clock REF_CLK signal with arriving edges of the feedback clock FB_CLK signal to determine if there is a difference in frequency and/or phase between REF_CLK and FB_CLK. The phase-frequency detector 1010 generates complementary "up" control signals (denoted UP, $\overline{UP}$) and complementary "down" signals (denoted DN, $\overline{DN}$) to control operation of the differential charge pump 1020. In some embodiments, the UP and DN control signals comprise voltage pulses with pulse widths that encode information regarding the phase difference (or phase error) between the REF_CLK and FB_CLK signals, wherein a polarity of the detected phase difference determines whether the UP or DN control signals are asserted.

For example, when the rising edges of the reference signal REF_CLK lead the rising edges of the feedback signal FB_CLK (e.g., the divided output signal RF_OUT), the phase-frequency detector 1010 will assert the UP control signal to logic 1 (logic high state) and maintain the DN control signal at logic 0 (logic low state). On the other hand, when the rising edges of the reference signal REF_CLK lag the rising edges of the feedback signal FB_CLK, the phase-frequency detector 1010 will assert the DN control signal to logic 1 and maintain the UP control signal at logic 0. When the rising edges of the reference signal REF_CLK are aligned to the rising edges of the feedback signal FB_CLK, the phase-frequency detector 1010 will maintain both control signals UP and DN at logic 0.

The differential charge pump 1020 is responsive to the complementary UP and DN control signals to generate respective control signals CHP and $\overline{CHP}$ which control operation of the loop filter 1030, and cause the loop filter 1030 to generate/adjust a differential control signal, VCON_P and VCON_N, which is applied to the control voltage input of the VCO 1040 to tune/adjust the frequency $f_{VCO}$ of a differential output signal VP and VN of the VCO 1040. In some embodiments, the loop filter 1030 comprises one or more capacitors which are charged and discharged in response to the respective control signals CHP and $\overline{CHP}$ to adjust the differential control signal, VCON_P and VCON_N output from the loop filter 1030.

For example, in response to an UP control signal of logic 1 (with DN set at logic 0), the differential charge pump 1020 generates the control signal CHP which causes the charge on the capacitor(s) of the loop filter 1030 to increase by an amount that is proportional to the magnitude of the phase difference. In some embodiments, the control signal CHP comprises a charging current (e.g., current pulse) that is sourced by a current source of the differential charge pump 1020. The increased charge of the capacitor(s) causes a proportional increase in the differential control voltage VCON_P and VCON_N that is applied to the VCO 1040. An increase in the differential control voltage VCON_P and VCON_N causes an increase in the output frequency $f_{VCO}$ of the VCO.

On the other hand, in response to a DN control signal of logic 1 (with UP set at logic 0), the differential charge pump 1020 generates the control signal $\overline{CHP}$ which causes the charge on the capacitor(s) of the loop filter 1030 to decrease by an amount that is proportional to the magnitude of the phase difference. In some embodiments, the control signal $\overline{CHP}$ comprises a discharging current (current pulse) that is sunk by a current source of the differential charge pump 1020. The decreased charge of the capacitor(s) causes a proportional decrease in the differential control voltage VCON_P and VCON_N that is applied to the VCO 1040. A decrease in the differential control voltage VCON_P and VCON_N causes a decrease in the output frequency $f_{VCO}$ of the VCO.

Furthermore, for a differential charge pump 1020 and loop filter 1030 configuration, the differential charge pump 1020 and/or loop filter 1030 will implement some type of common mode control circuitry to set and maintain a common mode voltage for the differential control voltage VCON_P and VCON_N. In this regard, as noted above, the differential charge pump 1020 and loop filter 1030 can be implemented using any circuit architecture which is suitable for the given application.

In some embodiments, the VCO 1040 comprises LC tank circuitry in which a variable capacitance of the LC tank circuitry is implemented with VVRTC varactor circuitry which comprises at least one, or a plurality of VVRTC varactor devices connected in parallel, to the LC tank circuit nodes P and N, such as described above in conjunction with, e.g., FIGS. 4 and 7. In some embodiments, the tuning terminals 121 and 122 of a given VVRTC varactor device are coupled to a calibration control system which is configured to generate the tuning voltages VREF_N and VREF_P than that are applied to the tuning terminals 121 and 122 of the given VVRTC varactor device to tune operating characteristics of the VVRTC varactor device and, thus, the operating characteristics of the VCO 1040.

Figure 11:
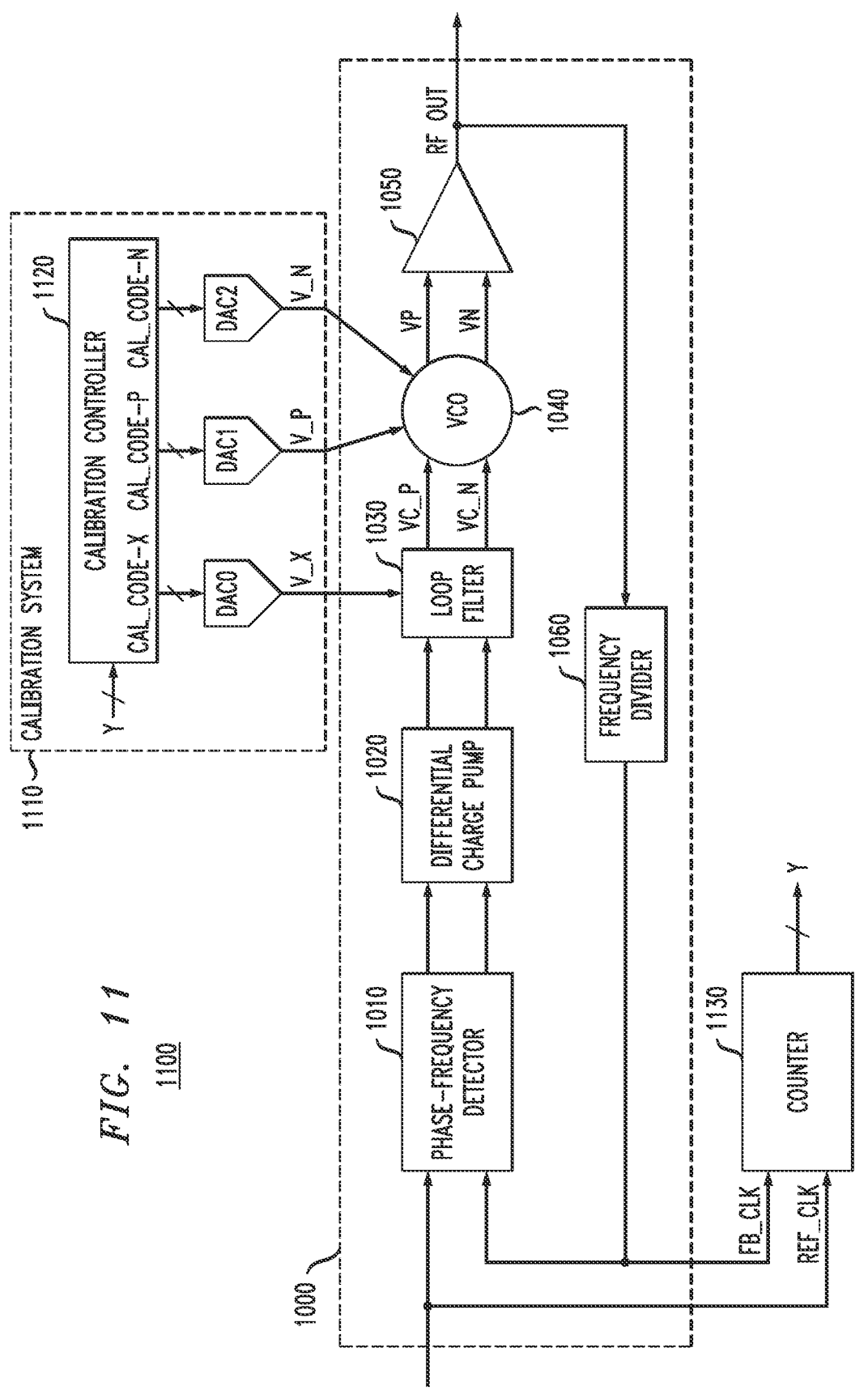

For example, FIG. 11 schematically illustrates a system for calibrating a phase-locked loop system comprising a voltage-controlled oscillator which is implements a VVRTC varactor with differential control, according to an exemplary embodiment of the disclosure. In particular, FIG. 11 schematically illustrates a system 1100 comprising a PLL system 1000, and a calibration system 1110 which is configured to calibrate a VCO of the PLL system 1000. The structure and operation of the PLL system 1000 is the same or similar to that discussed above in conjunction with FIG. 10, the details of which will not be repeated. The calibration system 1110 comprises a calibration controller 1120, a plurality of digital-to-analog converter (DAC) circuits, denoted DAC0, DAC1, and DAC2, and a counter 1130.

The calibration controller 1120 is configured to perform a calibration process (e.g., open loop calibration process) in which the calibration controller 1120 generates digital calibration codes, e.g., CAL_CODE-X, CAL_CODE-P, and CAL_CODE-N, which are applied to the respective DAC circuits, DAC0, DAC1, and DAC2. The DAC0 circuit generates a DC calibration voltage V_X which is proportional to the digital code CAL_CODE-X. The calibration voltage V_X is input to the loop filter 1030. In addition, the DAC1 and DAC2 circuits generate respective DC calibration voltages V_P and V_N, based on the respective digital codes CAL_CODE-P, and CAL_CODE-N. The calibration voltages V_P and V_N are applied to the VCO 1040 (e.g., applied to the tuning terminals 122-$x$ and 121-$x$ of the VVRTC varactor device 700-$x$, FIG. 7). As explained in further detail below, the calibration process generally involves (i) measuring the open loop output frequency of the VCO 1040 in response to the calibration voltages, (ii) utilizing the measured open loop output frequencies of the VCO 1040 to determine open loop VCO tuning characteristics data (e.g., estimated transfer curve (or characteristic curve) of the VCO frequency as a function of calibration voltage), and (iii) determine VCO gain based on the curve of the VCO frequency as a function of calibration voltage.

In some embodiments, the calibration voltage V_X, along with a configuration in an output stage of the differential charge pump 1020, generate two voltages, denoted VC_P and VC_N. For example, in some embodiments, $VC\_P = (\alpha * V_{DD}) + (0.5 * \Delta V)$, and $VC\_N = (\alpha * V_{DD}) - (0.5 * \Delta V)$, where $0 < \alpha < 1$. Hence, by changing the digital code CAL_CODE-X applied to the DAC0, the differential voltage $\Delta V$ can be changed, while the common mode voltage is changed by changing $\alpha$, wherein $\alpha$ is adjusted by changing the output stage of the differential charge pump 1020.

Furthermore, in some embodiments, the reference voltage V_P generated by DAC1 is given by $V\_P = V_{DD} - \beta$, wherein the value of $\beta$ corresponds to the digital code CAL_CODE-P. Moreover, in some embodiments, the reference voltage V_N generated by DAC2 is given by $V\_N = \gamma$, wherein the value of $\gamma$ corresponds to the digital code CAL_CODE-N. In this regard, the parameters $\beta$ and $\gamma$ are independently controlled using the digital codes CAL_CODE-P and CAL_CODE-N that are generated by the calibration controller 1120 and output to DAC1 and DAC2, respectively.

The calibration system 1110 utilizes the counter 1130 to determine the VCO output frequency for a given calibration code that applied to the phase-locked loop system 1000 for each iteration of the calibration process. For example, each time a calibration code is changes, the counter 1130 is initialized to perform a counting operation. In some embodiments, the counter 1130 is configured to measure the VCO frequency divided by K (a low frequency) within a known period of a known accurate frequency derived from the reference clock frequency REF_CLK. For example, assuming the VCO 1040 is configured to operate at 10 GHz, the VCO output frequency can be divided by 1000 to obtain a 10 MHz clock, which can then be measured by a precise 100 kHz reference clock derived from the reference clock signal REF_CLK. For example, if REF_CLK has a frequency of 20 MHz, it will be divided by 200.

Figure 12A:
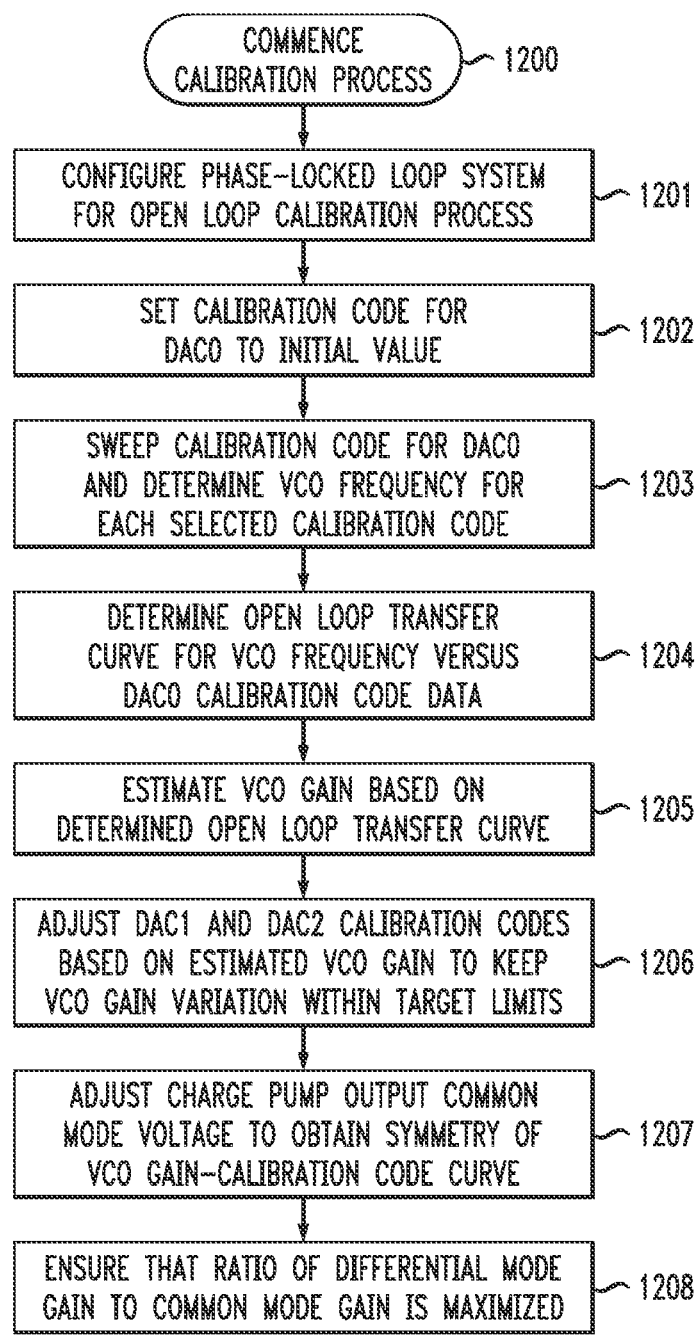
FIGS. 12A, 12B, and 12C illustrate a calibration process which is performed by the calibration system of FIG. 11, according to an exemplary embodiment of the disclosure.
Figure 12B:
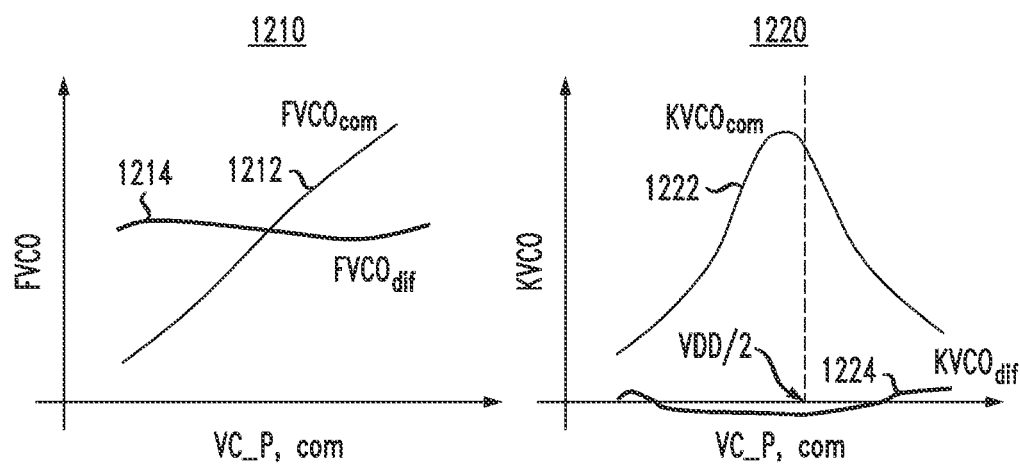
Figure 12C:
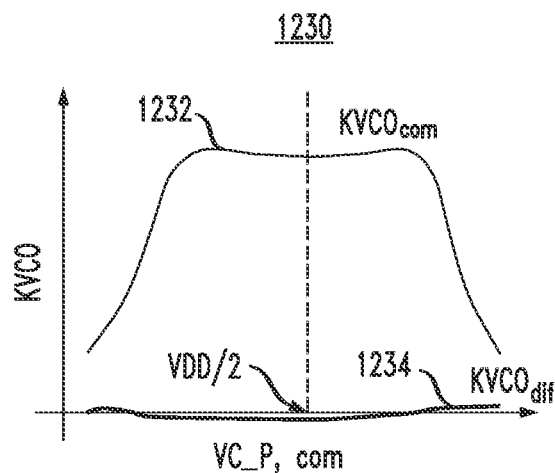

FIGS. 12A, 12B, and 12C illustrate a calibration process which is performed by the calibration system 1110 of FIG. 11, according to an exemplary embodiment of the disclosure. More specifically, FIG. 12A illustrates a flow diagram of calibration process which is implemented by the calibration system 1110 of FIG. 11 to calibrate a VCO which implements VVRTC varactor circuit according to an exemplary embodiment of the disclosure. When a calibration process is commenced (block 1200), the calibration system 1110 will configure the phase-locked loop system 1000 for an open loop calibration process (block 1201). In a normal mode of operation, the phase-frequency detector 1010, the differential charge pump 1020, the loop filter 1030, the VCO 1040, the output buffer 1050, and the frequency divider 1060 are active and function in a manner such as described above in conjunction with FIG. 10. In a calibration mode (e.g., an open loop calibration mode), the PLL system 1000 operates in open loop, wherein the phase-frequency detector 1010 is not active, the differential charge pump 1020, the loop filter 1030, the VCO 1040, the output buffer 1050, and the frequency divider 1060 are active. In some embodiments, the frequency divider 1060 is programmed to provide an integer-N division with N set to K to divide the VCO output frequency to a low frequency for calibration analysis. In some embodiments, the differential charge pump 1020 comprises a multiplexer circuit which is configured to select (i) a PLL path during normal operation, and (ii) or a calibration path during the calibration mode. In the calibration mode, the DAC0 provides a DC voltage V_X to the loop filter 1030, which is proportional to the calibration digital code X.

The calibration controller 1120 sets a calibration code for DAC0 to an initial value (block 1202), and then sweeps the calibration code for the DAC0 over a set of calibration codes and determines the VCO frequency generated for each DAC0 calibration code (block 1203). For example, in an exemplary embodiment, the DAC0 may be a 9-bit DAC, providing codes between 0 to 511, wherein high/mid/low values could be 63, 127, 191, 255, 319, 383, 447, which are increments of 64. Additional calibration code iterations may be utilized for a more accurate estimate of the VCO gain KVCO at the cost of calibration time.

As the digital code to the DAC0 is swept from a high to low value, the counter 1130 determines the VCO output frequency for each DAC0 code, and provides digital data Y to the calibration system 1110 representing the determined VCO frequency for each DAC0 code. The calibration system 1110 utilizes the determined VCO frequency data to estimate an open loop transfer curve for the VCO frequency versus the DAC0 calibration code (block 1204). In some embodiments, the transfer curve is estimated using a piecewise linear approximation of the data to determine the open loop VCO tuning characteristics. The calibration system 1110 then estimates the VCO gain (KVC) as function of the based on a slope of the estimated open loop transfer curve by, e.g., computing a derivative of the VCO frequency versus DAC0 code data to determine the VCO gain, KVCO (block 1205).

Once the KVCO value is determined, the DAC1 and DAC2 codes are adjusted based on a mathematical equation to obtain a desired KVCO variation throughout the useable range for control voltages, or to maximize control voltage range for the desired linear VCO gain for optimum phase-locked loop stability (block 1206). The common mode voltage output of the differential charge pump 1020 is adjusted to obtain symmetry in the transfer curve of VCO gain versus the DAC1 and DAC2 calibration code (block 1207). The calibration proceeds to ensure that a ratio of the differential mode gain to the common mode gain is maximized (block 1208).

FIGS. 12B and 12C graphically illustrate various stages of the calibration process of FIG. 12A. For example, FIG. 12B depicts a graph 1210 of VCO output frequency as a function of VC_P (common mode calibration). The graph 1210 comprises a first transfer curve 1212 of VCO frequency (common mode) versus VC_P (common mode), and a second transfer curve 1214 of VCO frequency (differential mode) versus VC_P (common mode). As noted above, during the calibration process, the control voltage VC_P is set at VC_P=($\alpha^*V_{DD}$)+(0.5*$\Delta$V), where only ($\alpha^*V_{DD}$)=VCONTRLcom is swept from 0 to VDD (by varying $\alpha$) in the common mode control calibration. On the other hand, VC_N=($\alpha^*V_{DD}$)−(0.5*$\Delta$V), where only (0.5*$\Delta$V)=VCONTRLdiff is swept from −$V_{DD}$ to $V_{DD}$ in the differential mode control calibration.

Further, FIG. 12B depicts a graph 1220 of VCO gain as a function of VC_P (common mode calibration). The graph 1220 comprises a first transfer curve 1222 of VCO common mode gain versus VC_P (common mode), and a second transfer curve 1224 of VCO differential gain versus VC_P (common mode). The graph 1220 illustrates that after KVCO calibration, there is narrow linear tuning range and the gain is not centered around $V_{DD}/2$. On the other hand, FIG. 12C depicts a graph 1230 of VCO gain as a function of VC_P (common mode calibration) following a linearization calibration process. The graph 1230 comprises a first transfer curve 1232 of VCO common mode gain versus VC_P (common mode), and a second transfer curve 1234 of VCO differential gain versus VC_P (common mode). The graph 1230 illustrates that after linearization, there is wider linear tuning range, and the gain is centered around $V_{DD}/2$.

Figure 13:
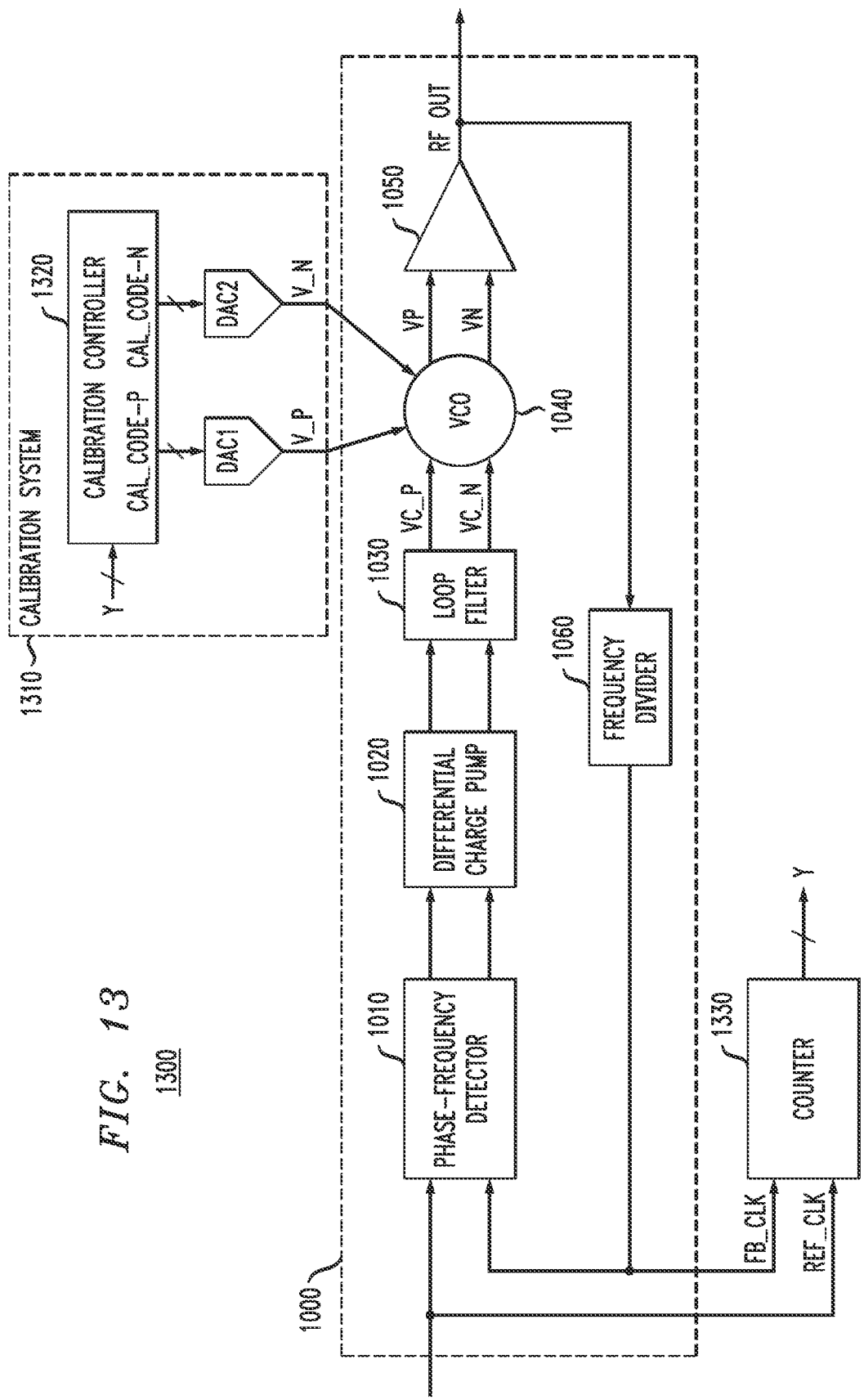
FIG. 13 schematically illustrates a system for calibrating a phase-locked loop system comprising a voltage-controlled oscillator which is implements a variable capacitor device with differential control, according to another exemplary embodiment of the disclosure.

Next, FIG. 13 schematically illustrates a system for calibrating a phase-locked loop system comprising a voltage-controlled oscillator which implements a VVRTC varactor with differential control, according to another exemplary embodiment of the disclosure. In particular, FIG. 13 schematically illustrates a system 1300 comprising a PLL system 1000, and a calibration system 1310 which is configured to calibrate a VCO of the PLL system 1000. The structure and operation of the PLL system 1000 is the same or similar to that discussed above in conjunction with FIG. 10, the details of which will not be repeated. The calibration system 1310 comprises a calibration controller 1320, a plurality of digital-to-analog converter (DAC) circuits, denoted DAC1, and DAC2, and a counter 1330. The calibration system 1310 is similar to the calibration system 1110 of FIG. 11, except that calibration system 1310 eliminates the use of DAC0 (e.g., area savings option), and only DAC1 and DAC2 are used.

During an open loop calibration mode, the output voltage of the differential charge pump 1020 is set to 0.5*VDD (which is the middle of the rail), and the calibration codes CAL_CODE-P, and CAL_CODE-N, which are applied to the respective DAC circuits, DAC1 and DAC2, are swept to determines slopes of the KVCO gain versus control voltage curve. Using the mathematical model, the calibration code CAL_CODE-P, and the calibration code CAL_CODE-N are adjusted to maximize the linear analog tuning range of the VVRTC varactor of the VCO 1040.

Figure 14A:
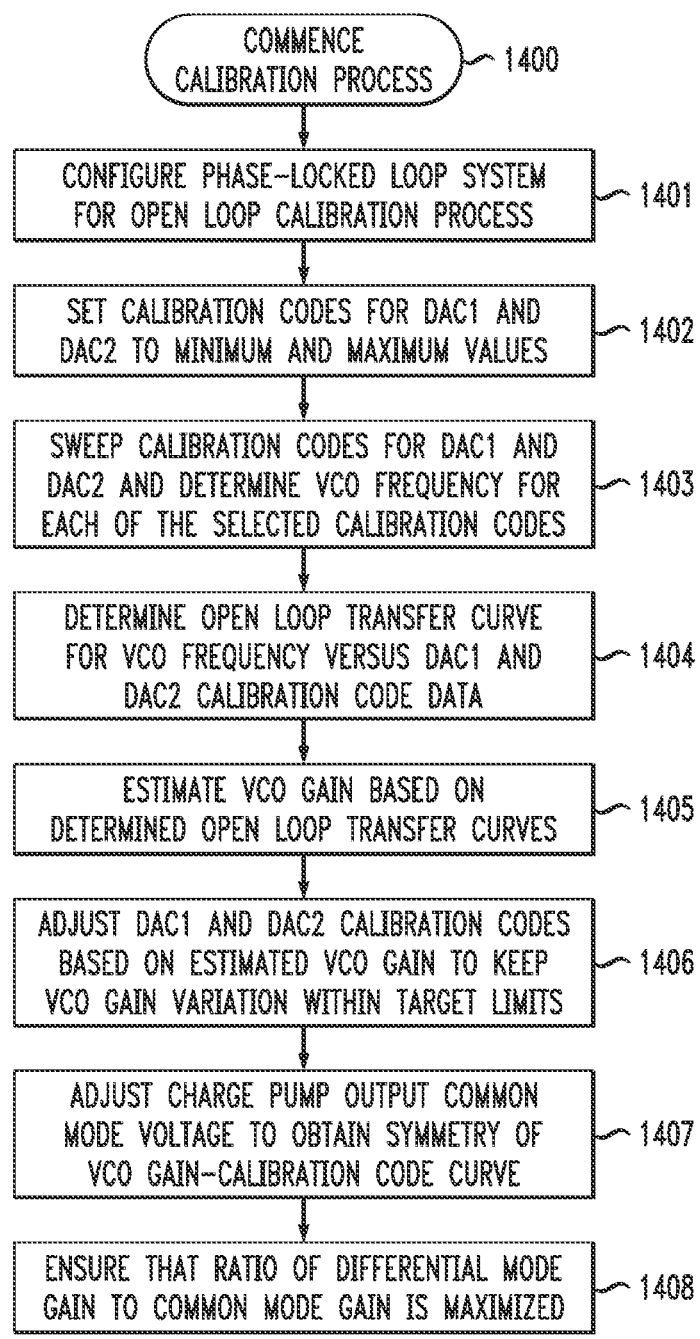

FIGS. 14A and 14B illustrate a calibration process which is performed by the calibration system 1310 of FIG. 13, according to an exemplary embodiment of the disclosure. More specifically, FIG. 14A illustrates a flow diagram of calibration process which is implemented by the calibration system 1310 of FIG. 13 to calibrate a VCO which implements a VVRTC varactor circuit according to an exemplary embodiment of the disclosure. When a calibration process is commenced (block 1400), the calibration system 1310 will configure the phase-locked loop system 1000 for an open loop calibration process (block 1401) such as discussed above in conjunction with FIG. 12A, but with the difference that the output voltage of the differential charge pump 1020 is set to 0.5*VDD (middle of the rail) during a code calibration sweep.

The calibration controller 1320 initializes the calibration codes for DAC1 and DAC2 to minimum and maximum values (block 1402), and then sweeps the calibration codes for the DAC1 and DAC2 and determines the VCO frequency versus control voltage for the DAC1 and DAC2 calibration codes (block 1403). As the digital codes to the DAC1 and DAC2 are swept, the counter 1330 determines the VCO output frequency for the DAC1 and DAC2 codes, and provides digital data Y to the calibration system 1310 representing the determined VCO frequency for each the DAC1 and DAC2 codes. The calibration system 1310 utilizes the determined VCO frequency data to estimate an open loop transfer curve for the VCO frequency versus the DAC1 and DAC2 calibration codes (block 1404) using, e.g., a piecewise linear approximation to determine the open loop VCO tuning characteristics. The calibration system 1310 then estimates the VCO gain (KVC) based on a slope of the estimated open loop transfer curve by, e.g., computing a derivative of the VCO frequency versus DAC1 and DAC2 code data to determine the VCO gain, KVCO (block 1405).

Once the KVCO value is determined, the DAC1 and DAC2 codes are adjusted based on a mathematical equation to obtain a desired KVCO variation throughout the useable range for control voltages, or to maximize control voltage range for the desired linear VCO gain for optimum phase-locked loop stability (block 1406). In some embodiments, this process involves favoring a lowest estimated slope between DAC1 and DAC2, and adjusting the DAC with the higher slope (see FIG. 14B). The common mode voltage output of the differential charge pump 1020 is adjusted to obtain symmetry in the transfer curve of VCO gain versus the DAC1 and DAC2 calibration codes (block 1407). The calibration proceeds to ensure that a ratio of the differential mode gain to the common mode gain is maximized (block 1408).

FIG. 14B graphically illustrate various stages of the calibration process of FIG. 14A. For example, FIG. 14B depicts a graph 1410 of VCO output frequency as a function of VC_P (common mode calibration). The graph 1410 comprises a first transfer curve 1412 of VCO frequency (common mode) versus VC_P (common mode), and a second transfer curve 1414 of VCO frequency (differential mode) versus VC_P (common mode). As noted above, during the calibration process, the control voltage VC_P is set at $VC\_P=(\alpha*V_{DD})+(0.5*\Delta V)$, where only $(\alpha*V_{DD})$=VCONTRLcom is maintained at $V_{DD}/2$ in the common mode control calibration. On the other hand, $VC\_N=(\alpha*V_{DD})-(0.5*\Delta V)$, where only $(0.5*\Delta V)$=VCONTRLdiff is swept from $-V_{DD}$ to $V_{DD}$ in the differential mode control calibration.

Further, FIG. 14B depicts a graph 1420 of VCO gain as a function of VC_P (common mode calibration). The graph 1420 comprises a first transfer curve 1422 of VCO common mode gain versus VC_P (common mode), and a second transfer curve 1424 of VCO differential gain versus VC_P (common mode). The graph 1420 illustrates that after KVCO calibration, there is an asymmetric tuning curve that is not centered around $V_{DD}/2$, and that there are two sloped portions (i) and (ii) of the first transfer curve 1422.

Many other ways of calibration are possible, each method providing its own trade-off between accuracy, complexity, power consumption, area requirement, and the calibration time needed for finding a unique solution for the desired calibration. At the end of the calibration process, a KVCO-to-VCTRL transfer curve is obtained which (a) is symmetric around half of the supply voltage for maximizing the charge pump output common mode range, (b) maximizes the ratio of the VCO differential mode gain (KVCO,DM) to the VCO common mode gain (KVCO,DM), to thereby achieve high common mode noise immunity, and which (c) minimizes KVCO,DM,max/KVCO,DM,min over the operating range for nearly constant PLL phase margin for the operation range under lock condition.

While the exemplary embodiments discussed herein utilize the DACS primarily for calibration purposes, in other embodiments, the DACs can be used for dynamic tuning configurations the digital code can be changed with time using a desired pattern to create a spread spectrum, frequency chirp or other types of frequency vs time characteristics within the loop bandwidth of the PLL so that sufficient signal fidelity is obtained.

FIG. 15 schematically illustrates a quantum computing system which implements a phase-locked loop system with a voltage-controlled oscillator implemented using VVRTC varactor devices with differential control, according to an exemplary embodiment of the disclosure. In particular, FIG. 15 schematically illustrates a quantum computing system 1500 which comprises an arbitrary waveform generator (AWG) 1502 comprising a plurality of AWG channels 1502-1, ..., 1500-n, which control respective quantum bits Q1, ..., Qn. The AWG channels 1502-1, ..., 1500-n each comprise a baseband signal generator 1510, a digital-to-analog converter stage 1520 (or DAC stage 120), a filter stage 1530, a modulation stage 1540, and an impedance matching network 1550. The AWG 1502 further comprises a phase-locked loop system 1504, a buffer 1506, and a plurality of frequency dividers 1508-1, 1508-n, one for each AWG channel 1502-1, ..., 1502-n, to generate local oscillator (LO) signals (LO_1 and LO_Q) for the respective modulation stages 1540 of the respective AWG channels 1502-1, ..., 1502-n.

In the exemplary embodiment of FIG. 15, the AWG 1502 comprises a quadrature AWG system which is configured to process quadrature signals (referred to as IQ signals). As is known in the art, a quadrature signal comprises an in-phase (I) signal component, and a quadrature-phase (Q) signal component. A pair of signals that are in quadrature have the same frequency, but differ in phase by 90 degrees. In each AWG channel the baseband signal generator 1510 is configured to receive baseband data as input, and generate digital quadrature signals I and Q which represent the input baseband data. In this process, the baseband data that is input to the baseband signal generator 1510 is separated into two orthogonal digital components including an in-phase (I) baseband component and a quadrature-phase (Q) baseband component. In some embodiments, the baseband signal generator 1510 implements digital signal processing techniques based on a combination of hardware and software to generate the digital quadrature baseband signals I and Q. The baseband signal generator 110 will generate the requisite digital quadrature baseband IQ signals which are needed to generate an analog waveform (e.g., sinusoidal voltage waveform) with a target center frequency that is configured to operate or otherwise control a given quantum bit that is coupled to the output of the given AWG channel.

The DAC stage 1520 is configured to convert a digital baseband signal (e.g., a digital IQ signal output from the baseband signal generator 1510) to an analog baseband signal having a baseband frequency. The DAC stage 1520 comprises a first DAC circuit 1521 and a second DAC circuit 1522. The first DAC circuit 1521 is configured to convert the digital baseband component I to an analog baseband component I(t) having a baseband frequency, and the second DAC circuit 1522 is configured to convert the digital baseband component Q to an analog baseband component Q(t) having the same baseband frequency, but phase-shifted by 90 degrees relative to I(t). The DAC stage 1520 generates and outputs the analog baseband signals I(t) and Q(t) at a given sampling rate ($f_S$) or sampling frequency which, in some embodiments, is in a range of baseband frequencies of about 100 kHz to about 100 MHz. In some embodiments, the DAC circuits 1521 and 1522 are digitally configurable to adjust DAC operating parameters including, but not limited to, the sampling rate, analog output gain, etc.

The filter stage 1530 is configured to the filter the IQ analog signal components output from the DAC stage 1520 to thereby generate filtered analog IQ signals. The filter stage 1530 comprises a first filter circuit 1531 and a second filter circuit 1532. The first filter circuit 1531 is configured to filter the in-phase analog signal I(t) output from first DAC circuit 1521, and the second filter circuit 1532 is configured to filter the quadrature-phase analog signal Q(t) output from the second DAC circuit 1522. In some embodiments, the first and second filter circuits 1531 and 1532 comprise low-pass filters that are configured to pass the fundamental spectral components of the respective analog signals I(t) and Q(t), while suppressing the image components of the respective analog signals I(t) and Q(t). In other embodiments, the first and second filter circuits 1531 and 1532 can be configured as bandpass filters to pass a desired band of higher frequency image components of the respective analog baseband components I(t) and Q(t), while suppressing the fundamental spectral components and other image components of the respective analog baseband components I(t) and Q(t). In other embodiments, the first and second filter circuits 1531 and 1532 are configured as high-pass filters, as may be desired for a given application.

In some embodiments, the filter stage 1530 comprises configurable filter circuits in which, e.g., the cutoff frequencies of the first and second filter circuits 1531 and 1532 can be adjusted, or where the first and second filter circuits 1531 and 1532 can be configured to have different filter types (e.g., low-pass, band-pass, etc.) as desired for a given application. For example, in some embodiments, a bandpass filter can be configured using two low pass filters using known signal filtering techniques and architectures. In some embodiments, the filter configurations are digitally controlled by the digital control signals that are input to the filter stage 1530.

In some embodiments, the modulation stage 1540 is configured to perform analog IQ signal modulation (e.g., single-sideband (SSB) modulation) by mixing the filtered analog signals I(t) and Q(t), which are output from the filter stage 1530, with quadrature LO signals (e.g., an in-phase LO signal (LO_I) and a quadrature-phase LO signal (LO_Q)) to generate and output an analog RF signal (e.g., a single-sideband modulated RF output signal). The local oscillator signals LO_I and LO_Q signals each have the same LO frequency, but the LO_Q signal is phase-shifted by 90 degrees relative to the LO_I signal.

More specifically, the modulation stage 1540 comprises a first mixer circuit 1541, a second mixer circuit 1542, and a signal combiner circuit 1543. The first mixer circuit 1541 is configured to mix the filtered analog signal I(t) with the LO_I signal and generate a first RF signal output. The second mixer circuit 1542 is configured to mix the filtered analog signal Q(t) with the LO_Q signal and generate a second RF signal output. The first and second RF signals output from the first and second mixer circuits 1541 and 1542 are input to the signal combiner circuit 1543 and combined (e.g., added) to generate a single-sideband RF signal output.

In some embodiments, the frequency dividers 1508-1, . . . , 1508-n comprise a quadrature phase shifter circuit to generate the quadrature LO_I and LO_Q signals. For example, a quadrature phase shifter circuit is configured to receive an LO signal as input (which is generated by the phase-locked loop system 1504), and output the quadrature LO signals LO_I and LO_Q based on the LO input signal. In this configuration, the LO_I signal comprises the same frequency and phase as the input LO signal, and the LO_Q signal comprises the same frequency as the input LO signal, but with a phase shift of 90 degrees. The quadrature phase shifter circuit can be implemented using one of various quadrature phase shifting techniques known to those of ordinary skill in the art.

The impedance matching network 1550 is configured to match a source impedance or load impedance of the output of the modulation stage 1540 to a characteristic impedance ZO of the output of the given AWG channel. In some embodiments, the impedance matching network 1550 comprises a balun to convert a differential/balance output of the AWG channel to a single/unbalance output. In the exemplary embodiment of FIG. 15, the output of the impedance matching network 1550 is coupled to a respective quantum bit.

The phase-locked loop system 1504 generates an LO clock signal based on a reference clock signal REF_CLK and provides the LO clock signal to all the AWG channels through the buffer 1506. The LO clock signal is routed differentially to each of the frequency dividers 1508-1, . . . , 1508-n of the respective AWG channels 1502-1, . . . , 1502-n. As noted above, the frequency dividers 1508-1, . . . , 1508-n provide the in-phase and quadrature-phase LO signals to the respective mixer circuits 1541 and 1542. In some embodiments, the phase-locked loop system 1504 implements a differential topology as the phase-locked loop system 1000 shown and discussed above in conjunction with FIG. 10. The phase-locked loop system 1504 comprises a VCO which implements any of the VVRTC varactor circuits with differential control, as discussed hereon. An alternate configuration can be formed by driving the I and Q phases of the LO clock through a buffer coupled to the phase-locked loop system (e.g., a single frequency divider can be used to provide I and Q signals for all the AWG channels via the buffer).

Figure 16:
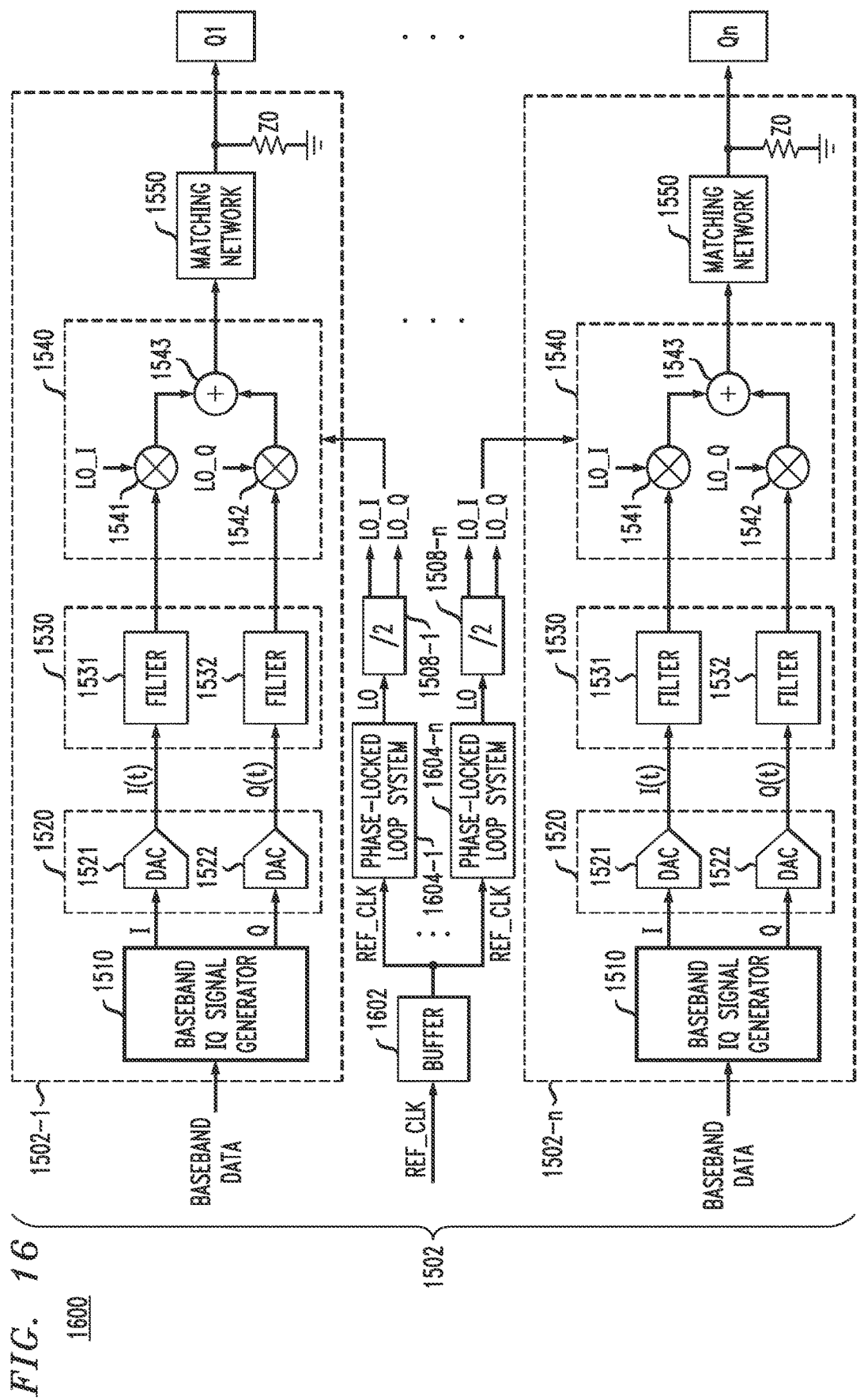
FIG. 16 schematically illustrates a quantum computing system which implements a phase-locked loop system with a voltage-controlled oscillator implemented using a variable capacitor device with differential control with differential control, according to another exemplary embodiment of the disclosure.

FIG. 16 schematically illustrates a quantum computing system which implements a phase-locked loop system with a voltage-controlled oscillator implemented using VVRTC varactor devices with differential control, according to another exemplary embodiment of the disclosure. In particular, FIG. 16 schematically illustrates a quantum computing system 1600 which is similar to the quantum computing system 1500 of FIG. 15, except that the AWG 1502 in FIG. 16 comprises a buffer 1602 which receives a reference clock signal REF_CLK, which is distributed through the AWG array and provided to individual phase-locked loop systems 1604-1, . . . 1604-n for the respective AWG channels 1502-1, . . . , 1502-n. In this instance, the reference clock REF_CLK synchronizes the LO clock phases for all the AWG channels. In some embodiments, each phase-locked loop system 1604-1, . . . , 1604-n implements a differential topology such as the phase-locked loop system 1000 shown and discussed above in conjunction with FIG. 10, and wherein each phase-locked loop system 1604-1, . . . , 1604-n comprises a VCO which implements any of the VVRTC varactor circuits with differential control, as discussed hereon. The exemplary embodiments of VVRTC varactor devices and circuitry as discussed herein are capable of sufficient and stable operation over a wide temperature range, including cryogenic temperatures and, thus, can be readily utilized as components of cryo-electronics for implementing control circuitry for quantum computing systems.

Exemplary embodiments of the present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instructions by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be accomplished as one step, executed concurrently, substantially concurrently, in a partially or wholly temporally overlapping manner, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

Figure 17:
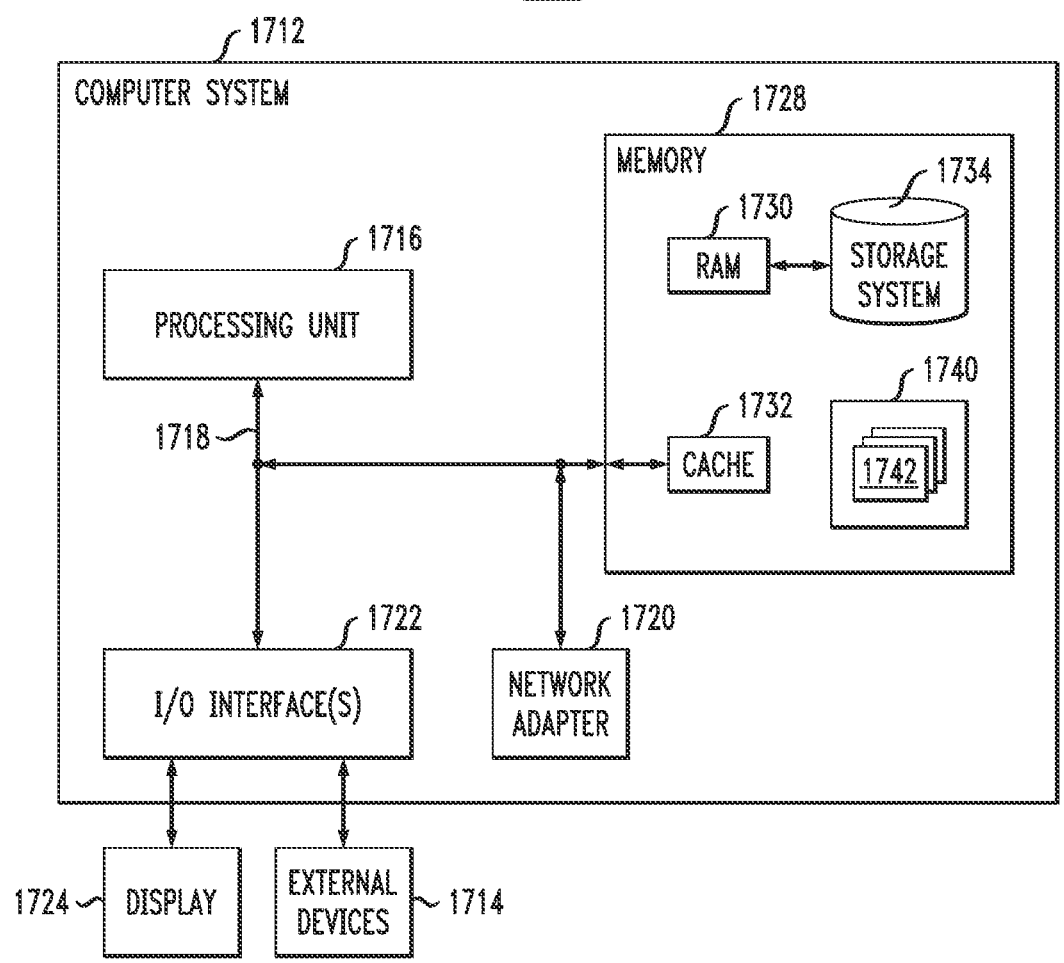
FIG. 17 schematically illustrates an exemplary architecture of a computing node which can host a computing system, according to an exemplary embodiment of the disclosure.

These concepts are illustrated with reference to FIG. 17, which schematically illustrates an exemplary architecture of a computing node that can be used to implement a software based control system for any of the exemplary systems as discussed herein. FIG. 17 illustrates a computing node 1700 which comprises a computer system/server 1712, which is operational with numerous other general purpose or special purpose computing system environments or configurations. Examples of well-known computing systems, environments, and/or configurations that may be suitable for use with computer system/server 1712 include, but are not limited to, personal computer systems, server computer systems, thin clients, thick clients, handheld or laptop devices, multiprocessor systems, microprocessor-based systems, set top boxes, programmable consumer electronics, network PCs, minicomputer systems, mainframe computer systems, and distributed cloud computing environments that include any of the above systems or devices, and the like.

Computer system/server 1712 may be described in the general context of computer system executable instructions, such as program modules, being executed by a computer system. Generally, program modules may include routines, programs, objects, components, logic, data structures, and so on that perform particular tasks or implement particular abstract data types. Computer system/server 1712 may be practiced in distributed cloud computing environments where tasks are performed by remote processing devices that are linked through a communications network. In a distributed cloud computing environment, program modules may be located in both local and remote computer system storage media including memory storage devices.

In FIG. 17, computer system/server 1712 in computing node 1700 is shown in the form of a general-purpose computing device. The components of computer system/server 1712 may include, but are not limited to, one or more processors or processing units 1716, a system memory 1728, and a bus 1718 that couples various system components including system memory 1728 to the processors 1716.

The bus 1718 represents one or more of any of several types of bus structures, including a memory bus or memory controller, a peripheral bus, an accelerated graphics port, and a processor or local bus using any of a variety of bus architectures. By way of example, and not limitation, such architectures include Industry Standard Architecture (ISA) bus, Micro Channel Architecture (MCA) bus, Enhanced ISA (EISA) bus, Video Electronics Standards Association (VESA) local bus, and Peripheral Component Interconnects (PCI) bus.

The computer system/server 1712 typically includes a variety of computer system readable media. Such media may be any available media that is accessible by computer system/server 1712, and it includes both volatile and non-volatile media, removable and non-removable media.

The system memory 1728 can include computer system readable media in the form of volatile memory, such as random-access memory (RAM) 1730 and/or cache memory 1732. The computer system/server 1712 may further include other removable/non-removable, volatile/nonvolatile computer system storage media. By way of example only, storage system 1734 can be provided for reading from and writing to a non-removable, non-volatile magnetic media (not shown and typically called a "hard drive"). Although not shown, a magnetic disk drive for reading from and writing to a removable, non-volatile magnetic disk (e.g., a "floppy disk"), and an optical disk drive for reading from or writing to a removable, non-volatile optical disk such as a CD-ROM, DVD-ROM or other optical media can be provided. In such instances, each can be connected to bus 1718 by one or more data media interfaces. As depicted and described herein, memory 1728 may include at least one program product having a set (e.g., at least one) of program modules that are configured to carry out the functions of embodiments of the invention.

The program/utility 1740, having a set (at least one) of program modules 1742, may be stored in memory 1728 by way of example, and not limitation, as well as an operating system, one or more application programs, other program modules, and program data. Each of the operating system, one or more application programs, other program modules, and program data or some combination thereof, may include an implementation of a networking environment. Program modules 1742 generally carry out the functions and/or methodologies of embodiments of the disclosure as described herein.

Computer system/server 1712 may also communicate with one or more external devices 1714 such as a keyboard, a pointing device, a display 1724, etc., one or more devices that enable a user to interact with computer system/server 1712, and/or any devices (e.g., network card, modem, etc.) that enable computer system/server 1712 to communicate with one or more other computing devices. Such communication can occur via Input/Output (I/O) interfaces 1722. Still yet, computer system/server 1712 can communicate with one or more networks such as a local area network (LAN), a general wide area network (WAN), and/or a public network (e.g., the Internet) via network adapter 1720. As depicted, network adapter 1720 communicates with the other components of computer system/server 1712 via bus 1718. It should be understood that although not shown, other hardware and/or software components could be used in conjunction with computer system/server 1712. Examples, include, but are not limited to: microcode, device drivers, redundant processing units, external disk drive arrays, RAID systems, SSD drives, and data archival storage systems, etc.

Additionally, it is to be understood that although this disclosure includes a detailed description on cloud computing, implementation of the teachings recited herein are not limited to a cloud computing environment. Rather, embodiments of the present invention are capable of being implemented in conjunction with any other type of computing environment now known or later developed.

Cloud computing is a model of service delivery for enabling convenient, on-demand network access to a shared pool of configurable computing resources (e.g., networks, network bandwidth, servers, processing, memory, storage, applications, virtual machines, and services) that can be rapidly provisioned and released with minimal management effort or interaction with a provider of the service. This cloud model may include at least five characteristics, at least three service models, and at least four deployment models.

Characteristics are as follows:

On-demand self-service: a cloud consumer can unilaterally provision computing capabilities, such as server time and network storage, as needed automatically without requiring human interaction with the service's provider.

Broad network access: capabilities are available over a network and accessed through standard mechanisms that promote use by heterogeneous thin or thick client platforms (e.g., mobile phones, laptops, and PDAs).

Resource pooling: the provider's computing resources are pooled to serve multiple consumers using a multi-tenant model, with different physical and virtual resources dynamically assigned and reassigned according to demand. There is a sense of location independence in that the consumer generally has no control or knowledge over the exact location of the provided resources but may be able to specify location at a higher level of abstraction (e.g., country, state, or datacenter).

Rapid elasticity: capabilities can be rapidly and elastically provisioned, in some cases automatically, to quickly scale out and rapidly released to quickly scale in. To the consumer, the capabilities available for provisioning often appear to be unlimited and can be purchased in any quantity at any time.

Measured service: cloud systems automatically control and optimize resource use by leveraging a metering capability at some level of abstraction appropriate to the type of service (e.g., storage, processing, bandwidth, and active user accounts). Resource usage can be monitored, controlled, and reported, providing transparency for both the provider and consumer of the utilized service.

Service Models are as follows:

Software as a Service (SaaS): the capability provided to the consumer is to use the provider's applications running on a cloud infrastructure. The applications are accessible from various client devices through a thin client interface such as a web browser (e.g., web-based e-mail). The consumer does not manage or control the underlying cloud infrastructure including network, servers, operating systems, storage, or even individual application capabilities, with the possible exception of limited user-specific application configuration settings.

Platform as a Service (PaaS): the capability provided to the consumer is to deploy onto the cloud infrastructure consumer-created or acquired applications created using programming languages and tools supported by the provider. The consumer does not manage or control the underlying cloud infrastructure including networks, servers, operating systems, or storage, but has control over the deployed applications and possibly application hosting environment configurations.

Infrastructure as a Service (IaaS): the capability provided to the consumer is to provision processing, storage, networks, and other fundamental computing resources where the consumer is able to deploy and run arbitrary software, which can include operating systems and applications. The consumer does not manage or control the underlying cloud infrastructure but has control over operating systems, storage, deployed applications, and possibly limited control of select networking components (e.g., host firewalls).

Deployment Models are as follows:

Private cloud: the cloud infrastructure is operated solely for an organization. It may be managed by the organization or a third party and may exist on-premises or off-premises.

Community cloud: the cloud infrastructure is shared by several organizations and supports a specific community that has shared concerns (e.g., mission, security requirements, policy, and compliance considerations). It may be managed by the organizations or a third party and may exist on-premises or off-premises.

Public cloud: the cloud infrastructure is made available to the general public or a large industry group and is owned by an organization selling cloud services.

Hybrid cloud: the cloud infrastructure is a composition of two or more clouds (private, community, or public) that remain unique entities but are bound together by standardized or proprietary technology that enables data and application portability (e.g., cloud bursting for load-balancing between clouds).

A cloud computing environment is service oriented with a focus on statelessness, low coupling, modularity, and semantic interoperability. At the heart of cloud computing is an infrastructure that includes a network of interconnected nodes.

Figure 18:
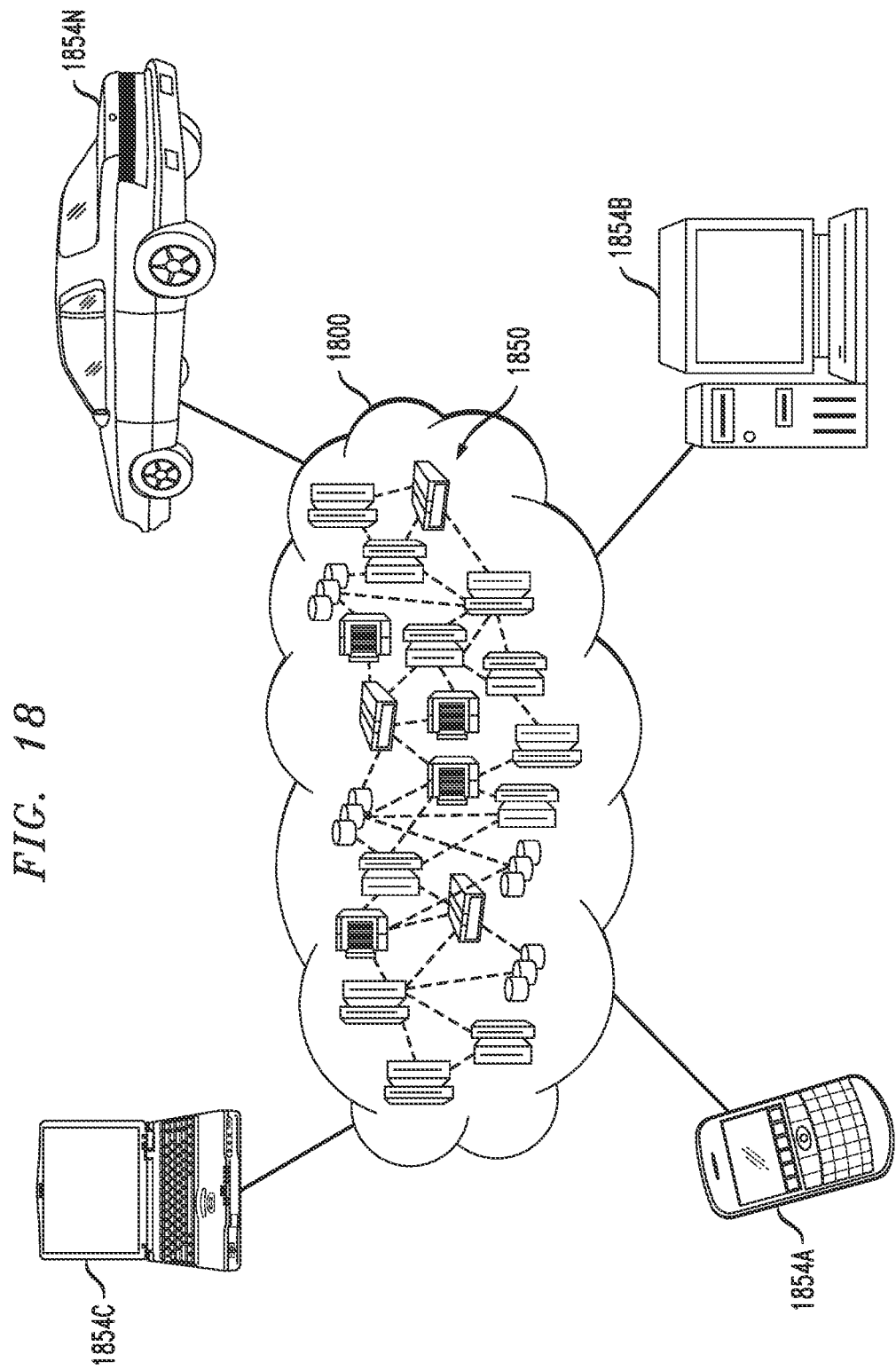
FIG. 18 depicts a cloud computing environment according to an exemplary embodiment of the disclosure.

Referring now to FIG. 18, illustrative cloud computing environment 1800 is depicted. As shown, cloud computing environment 1800 includes one or more cloud computing nodes 1850 with which local computing devices used by cloud consumers, such as, for example, personal digital assistant (PDA) or cellular telephone 1854A, desktop computer 1854B, laptop computer 1854C, and/or automobile computer system 1854N may communicate. Nodes 1850 may communicate with one another. They may be grouped (not shown) physically or virtually, in one or more networks, such as Private, Community, Public, or Hybrid clouds as described hereinabove, or a combination thereof. This allows cloud computing environment 1800 to offer infrastructure, platforms and/or software as services for which a cloud consumer does not need to maintain resources on a local computing device. It is understood that the types of computing devices 1854A-N shown in FIG. 18 are intended to be illustrative only and that computing nodes 1850 and cloud computing environment 1800 can communicate with any type of computerized device over any type of network and/or network addressable connection (e.g., using a web browser).

Figure 19:
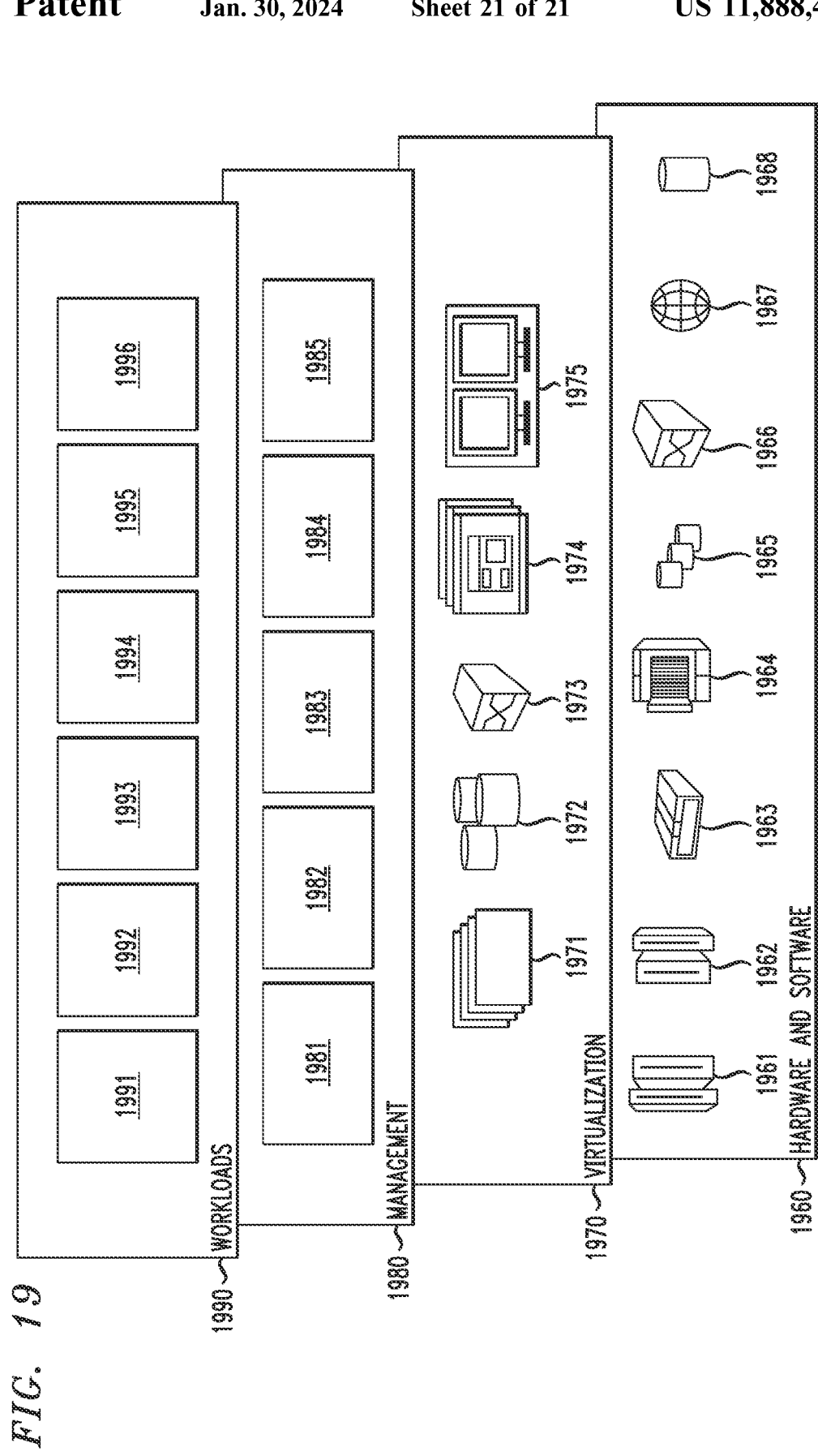
FIG. 19 depicts abstraction model layers according to an exemplary embodiment of the disclosure.

Referring now to FIG. 19, a set of functional abstraction layers provided by cloud computing environment 1800 (FIG. 18) is shown. It should be understood in advance that the components, layers, and functions shown in FIG. 19 are intended to be illustrative only and embodiments of the invention are not limited thereto. As depicted, the following layers and corresponding functions are provided:

Hardware and software layer 1960 includes hardware and software components. Examples of hardware components include: mainframes 1961; RISC (Reduced Instruction Set Computer) architecture based servers 1962; servers 1963; blade servers 1964; storage devices 1965; and networks and networking components 1966. In some embodiments, software components include network application server software 1967 and database software 1968.

Virtualization layer 1970 provides an abstraction layer from which the following examples of virtual entities may be provided: virtual servers 1971; virtual storage 1972; virtual networks 1973, including virtual private networks; virtual applications and operating systems 1974; and virtual clients 1975.

In one example, management layer 1980 may provide the functions described below. Resource provisioning 1981 provides dynamic procurement of computing resources and other resources that are utilized to perform tasks within the cloud computing environment. Metering and Pricing 1982 provide cost tracking as resources are utilized within the cloud computing environment, and billing or invoicing for consumption of these resources. In one example, these resources may include application software licenses. Security provides identity verification for cloud consumers and tasks, as well as protection for data and other resources. User portal 1983 provides access to the cloud computing environment for consumers and system administrators. Service level management 1984 provides cloud computing resource allocation and management such that required service levels are met. Service Level Agreement (SLA) planning and fulfillment 1985 provide pre-arrangement for, and procurement of, cloud computing resources for which a future requirement is anticipated in accordance with an SLA.

Workloads layer 1990 provides examples of functionality for which the cloud computing environment may be utilized. Examples of workloads and functions which may be provided from this layer include: mapping and navigation 1991; software development and lifecycle management 1992; virtual classroom education delivery 1993; data analytics processing 1994; transaction processing 1995; and various functions 1996 for implementing a control system or a quantum computing system as discussed herein. Furthermore, in some embodiments, the hardware and software layer 1960 would include, e.g., various hardware systems as discussed herein to implement or otherwise support the various workloads and functions 1996 for performing, e.g., quantum computing.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A variable capacitor device, comprising:
   first and second control paths which are configured to enable differential control of the variable capacitor device in response to a differential control signal applied to first and second transistors of a same doping type in the first and second control paths, respectively;
   wherein the first and second transistors are configured as voltage variable resistors for tuning a capacitance of the variable capacitor device.

2. The device of claim 1, wherein both the first and second transistors comprise one of N-type field-effect transistors and P-type field-effect transistors.

3. The device of claim 1, wherein:
   the first control path comprises the first transistor and at least one capacitor serially connected between a first terminal and a second terminal of the variable capacitor device;

the second control path comprises the second transistor and at least one capacitor serially connected between the first terminal and the second terminal of the variable capacitor device; and the variable capacitor device further comprises:
- differential control terminals comprising a first control terminal and a second control terminal, wherein the first control terminal is coupled to a gate terminal of the first transistor, and the second control terminal is coupled to first and second source/drain terminals of the second transistor; and
- a first tuning terminal and a second tuning terminal, wherein the first tuning terminal is coupled to first and second source/drain terminals of the first transistor, and the second tuning terminal is coupled to a gate terminal of the second transistor.

4. The device of claim 3, wherein:
the first control terminal is coupled to the gate terminal of the first transistor by a first resistive element;
the first tuning terminal is coupled to the first source/drain terminal of the first transistor by a second resistive element, and to the second source/drain terminal of the first transistor by a third resistive element;
the second tuning terminal is coupled to the gate terminal of the second transistor by a fourth resistive element;
the second control terminal is coupled to the first source/drain terminal of the second transistor by a fifth resistive element, and to the second source/drain terminal of the second transistor by a sixth resistive element; and
the first, second, third, fourth, fifth, and sixth resistive elements comprise one of (i) passive resistor devices and (ii) transistor devices configured in cut off mode.

5. The device of claim 3, wherein the differential control terminals are configured to receive the differential control signal to tune the capacitance of the variable capacitor device by changing an impedance of the first and second transistors, wherein the differential control signal comprises an analog differential control voltage.

6. The device of claim 3, wherein the first and second tuning terminals are configured to receive respective first and second reference voltages to tune a capacitance-to-differential voltage transfer characteristic of the variable capacitor device.

7. The device of claim 3, wherein the first and second tuning terminals are configured to receive respective first and second reference voltages to adjust a ratio of a differential mode gain to a common mode gain of the variable capacitor device.

8. The device of claim 3, further comprising:
a first voltage variable resistive element coupled in parallel to the first transistor and configured to adjust an effective capacitance in the first control path;
a second voltage variable resistive element coupled in parallel to the second transistor and configured to adjust an effective capacitance in the second control path.

9. The device of claim 8, wherein:
the first voltage variable resistive element comprises a serially connected third transistor and fourth transistor which comprise gate terminals that are commonly coupled to a third tuning terminal, and which comprise first source/drain terminals that are commonly coupled to the first tuning terminal; and
the second voltage variable resistive element comprises a serially connected fifth transistor and sixth transistor which comprise gate terminals that are commonly coupled to a fourth tuning terminal, and which comprise first source/drain terminals that are commonly coupled to the second control terminal.

10. A device, comprising:
an oscillator circuit comprising a resonant tank circuit;
wherein the resonant tank circuit comprises a variable capacitor device comprising first and second control paths which are configured to enable differential control of the variable capacitor device in response to a differential control signal applied to first and second transistors of a same doping type in the first and second control paths, respectively, wherein the first and second transistors are configured as voltage variable resistors for tuning a capacitance of the variable capacitor device.

11. The device of claim 10, wherein both the first and second transistors comprise one of N-type field-effect transistors and P-type field-effect transistors.

12. The device of claim 10, wherein:
the first control path comprises the first transistor and at least one capacitor serially connected between a first terminal and a second terminal of the variable capacitor device;
the second control path comprises the second transistor and at least one capacitor serially connected between the first terminal and the second terminal of the variable capacitor device; and
the variable capacitor device further comprises:
- differential control terminals comprising a first control terminal and a second control terminal, wherein the first control terminal is coupled to a gate terminal of the first transistor, and the second control terminal is coupled to first and second source/drain terminals of the second transistor; and
- a first tuning terminal and a second tuning terminal, wherein the first tuning terminal is coupled to first and second source/drain terminals of the first transistor, and the second tuning terminal is coupled to a gate terminal of the second transistor.

13. The device of claim 12, wherein:
the first control terminal is coupled to the gate terminal of the first transistor by a first resistive element;
the first tuning terminal is coupled to the first source/drain terminal of the first transistor by a second resistive element, and to the second source/drain terminal of the first transistor by a third resistive element;
the second tuning terminal is coupled to the gate terminal of the second transistor by a fourth resistive element;
the second control terminal is coupled to the first source/drain terminal of the second transistor by a fifth resistive element, and to the second source/drain terminal of the second transistor by a sixth resistive element; and
the first, second, third, fourth, fifth, and sixth resistive elements comprise one of (i) passive resistor devices, and (ii) transistor devices configured in cut off mode.

14. The device of claim 12, further comprising:
an analog differential tuning control system configured to generate the differential control signal as an analog differential control voltage that is applied to the differential control terminals of the variable capacitor device to adjust a capacitance of the tank circuit by changing an impedance of the first and second transistors; and
a calibration system configured to generate first and second reference voltages that are applied to the first and second tuning terminals, respectively, of the variable capacitor device to adjust at least one of (i) a capacitance-to-differential voltage transfer curve of the variable capacitor device and (ii) a ratio of a differential mode gain to a common mode gain of the variable capacitor device.

15. The device of claim 10, wherein:
the oscillator circuit comprises a voltage-controlled oscillator circuit;
the tank circuit comprises an inductor element coupled in parallel to the variable capacitor device; and
the voltage-controlled oscillator circuit comprises a transconductance cell comprising at least one cross-coupled pair of transistor devices, which is connected in parallel to the tank circuit.

16. A device, comprising:
a voltage-controlled oscillator circuit comprising a resonant tank circuit;
wherein the resonant tank circuit comprises a variable capacitor circuit comprising a plurality of variable capacitor devices connected in parallel to first and second tank nodes of the resonant tank circuit;
wherein each variable capacitor device comprises first and second control paths which are configured to enable differential control of the variable capacitor device in response to a differential control signal applied to first and second transistors of a same doping type in the first and second control paths, respectively, wherein the first and second transistors are configured as voltage variable resistors for tuning a capacitance of the variable capacitor device.

17. The device of claim 16, wherein both the first and second transistors of each variable capacitor device comprise one of N-type field-effect transistors which are substantially identical in structure, and P-type field-effect transistors which are substantially identical in structure.

18. The device of claim 16, wherein for each variable capacitor device:
the first control path comprises the first transistor and at least one capacitor serially connected between a first terminal and a second terminal of the variable capacitor device;
the second control path comprises the second transistor and at least one capacitor serially connected between the first terminal and the second terminal of the variable capacitor device;
the first and second terminals of the variable capacitor device are coupled to the first and second tank nodes, respectively, of the resonant tank circuit; and
each variable capacitor device further comprises:
differential control terminals comprising a first control terminal and a second control terminal, wherein the first control terminal is coupled to a gate terminal of the first transistor, and the second control terminal is coupled to first and second source/drain terminals of the second transistor; and
a first tuning terminal and a second tuning terminal, wherein the first tuning terminal is coupled to first and second source/drain terminals of the first transistor, and the second tuning terminal is coupled to a gate terminal of the second transistor.

19. The device of claim 18, wherein for each variable capacitor device:
the first control terminal is coupled to the gate terminal of the first transistor by a first resistive element;
the first tuning terminal is coupled to the first source/drain terminal of the first transistor by a second resistive element, and to the second source/drain terminal of the first transistor by a third resistive element;
the second tuning terminal is coupled to the gate terminal of the second transistor by a fourth resistive element;
the second control terminal is coupled to the first source/drain terminal of the second transistor by a fifth resistive element, and to the second source/drain terminal of the second transistor by a sixth resistive element; and
the first, second, third, fourth, fifth, and sixth resistive elements comprise one of (i) passive resistor devices and (ii) transistor devices with grounded gate terminals.

20. The device of claim 18, further comprising a calibration system configured to generate different sets of first and second reference voltages that are applied to respective first and second tuning terminals of two or more of the variable capacitor devices to adjust a capacitance-to-differential voltage transfer characteristic of each of the two or more of the variable capacitor devices, and obtain a more linearized capacitance-to-differential voltage transfer characteristic of the variable capacitor circuit of the resonant tank circuit.

21. The device of claim 18, wherein each variable capacitor device further comprises:
a first resistive element bank comprising one or more first voltage variable resistive elements coupled in parallel to the first transistor and configured to adjust an effective capacitance of the first transistor in the first control path; and
a second resistive element bank comprising one or more second voltage variable resistive elements coupled in parallel to the second transistor and configured to adjust an effective capacitance of the second transistor in the second control path.

22. A system, comprising:
a voltage-controlled oscillator; and
an analog differential tuning control system comprising a differential charge pump and a loop filter, wherein the analog differential tuning control system is configured to generate a differential control voltage to tune an output frequency of the voltage-controlled oscillator;
wherein the voltage-controlled oscillator comprises a resonant tank circuit;
wherein the resonant tank circuit comprises a variable capacitor circuit comprising a plurality of variable capacitor devices connected in parallel to first and second tank nodes of the resonant tank circuit;
wherein each variable capacitor device comprises first and second control paths which are configured to enable differential control of the variable capacitor device in response to the differential control voltage applied to first and second transistors of a same doping type in the first and second control paths, respectively, wherein the first and second transistors are configured as voltage variable resistors for tuning a capacitance of the variable capacitor device in response to the differential control voltage.

23. The system of claim 22, wherein for each variable capacitor device:
the first control path comprises the first transistor and at least one capacitor serially connected between a first terminal and a second terminal of the variable capacitor device;
the second control path comprises the second transistor and at least one capacitor serially connected between the first terminal and the second terminal of the variable capacitor device;
the first and second terminals of the variable capacitor device are coupled to the first and second tank nodes, respectively, of the resonant tank circuit; and each variable capacitor device further comprises:
  differential control terminals comprising a first control terminal and a second control terminal, wherein the first control terminal is coupled to a gate terminal of the first transistor, and the second control terminal is coupled to first and second source/drain terminals of the second transistor; and
  a first tuning terminal and a second tuning terminal, wherein the first tuning terminal is coupled to first and second source/drain terminals of the first transistor, and the second tuning terminal is coupled to a gate terminal of the second transistor;
wherein the phase-locked loop system further comprises a calibration system configured to generate different sets of first and second reference voltages that are applied to respective first and second tuning terminals of two or more of the variable capacitor devices to adjust at least one of (i) a capacitance-to-differential voltage transfer characteristic of each of the two or more of the variable capacitor devices, and (ii) a ratio of a differential mode gain of the voltage-controlled oscillator to a common mode gain of the voltage-controlled oscillator.

24. A system, comprising:
a plurality of quantum bits;
an arbitrary waveform generator system comprising a plurality of arbitrary waveform generator channels, wherein each arbitrary waveform generator channel is coupled to a respective quantum bit of the plurality of quantum bits, and configured to generate a radio frequency signal to control operation of the quantum bit;
a phase-locked loop system configured to generate a local oscillator signal which is utilized by modulation systems in the respective arbitrary waveform generator channels;
wherein the phase-locked loop system comprises:
voltage-controlled oscillator; and
an analog differential tuning control system comprising a differential charge pump and a loop filter, wherein the analog differential tuning control system is configured to generate a differential control voltage to tune an output frequency of the voltage-controlled oscillator;
wherein the voltage-controlled oscillator comprises a resonant tank circuit;
wherein the resonant tank circuit comprises a variable capacitor circuit comprising a plurality of variable capacitor devices connected in parallel to first and second tank nodes of the resonant tank circuit;
wherein each variable capacitor device comprises first and second control paths which are configured to enable differential control of the variable capacitor device in response to the differential control voltage applied to first and second transistors of a same doping type in the first and second control paths, respectively, wherein the first and second transistors are configured as voltage variable resistors for tuning a capacitance of the variable capacitor device in response to the differential control voltage.

25. The system of claim 24, wherein for each variable capacitor device:
  the first control path comprises the first transistor and at least one capacitor serially connected between a first terminal and a second terminal of the variable capacitor device;
  the second control path comprises the second transistor and at least one capacitor serially connected between the first terminal and the second terminal of the variable capacitor device;
  the first and second terminals of the variable capacitor device are coupled to the first and second tank nodes, respectively, of the resonant tank circuit; and
  each variable capacitor device further comprises:
    differential control terminals comprising a first control terminal and a second control terminal, wherein the first control terminal is coupled to a gate terminal of the first transistor, and the second control terminal is coupled to first and second source/drain terminals of the second transistor; and
    a first tuning terminal and a second tuning terminal, wherein the first tuning terminal is coupled to first and second source/drain terminals of the first transistor, and the second tuning terminal is coupled to a gate terminal of the second transistor;
  wherein the phase-locked loop system further comprises a calibration system configured to generate different sets of first and second reference voltages that are applied to respective first and second tuning terminals of two or more of the variable capacitor devices to adjust at least one of (i) a capacitance-to-differential voltage transfer characteristic of each of the two or more of the variable capacitor devices, and (ii) a ratio of a differential mode gain of the voltage-controlled oscillator to a common mode gain of the voltage-controlled oscillator.

* * * * *